(12) United States Patent
Liao et al.

(10) Patent No.: US 12,412,831 B2
(45) Date of Patent: Sep. 9, 2025

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Wei-Hao Liao, Taichung (TW); Hsi-Wen Tien, Hsinchu (TW); Chih Wei Lu, Hsinchu (TW); Yung-Hsu Wu, Taipei (TW); Cherng-Shiaw Tsai, New Taipei (TW); Chia-Wei Su, Taoyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 402 days.

(21) Appl. No.: 18/097,265

(22) Filed: Jan. 15, 2023

(65) Prior Publication Data

US 2024/0120272 A1    Apr. 11, 2024

Related U.S. Application Data

(60) Provisional application No. 63/414,538, filed on Oct. 9, 2022.

(51) Int. Cl.
*H01L 23/522* (2006.01)
*H01L 21/3065* (2006.01)
(Continued)

(52) U.S. Cl.
CPC ...... *H01L 23/5226* (2013.01); *H01L 21/3065* (2013.01); *H01L 21/76802* (2013.01);
(Continued)

(58) Field of Classification Search
CPC ............ H01L 23/5226; H01L 21/3065; H01L 21/76802; H01L 21/76831;
(Continued)

(56) References Cited

U.S. PATENT DOCUMENTS 6,326,296 B1 * 12/2001 Tsai ................. H01L 21/31116
257/E21.252
7,456,097 B1 * 11/2008 Hill .................. H01L 21/76804
257/E21.578

(Continued)

FOREIGN PATENT DOCUMENTS

CN    109427660 A  *  3/2019   ....... H01L 21/02126
CN    110504268 A  *  11/2019  ......... H01L 21/0274
(Continued)

*Primary Examiner* — Mohammed Shamsuzzaman
(74) *Attorney, Agent, or Firm* — NZ Carr Law Office

(57) ABSTRACT

Embodiments of the present disclosure relates to a method for forming a semiconductor device structure. The method includes including forming one or more conductive features in a first interlayer dielectric (ILD), forming an etch stop layer on the first ILD, forming a second ILD over the etch stop layer, forming one or more openings through the second ILD and the etch stop layer to expose a top surface of the one or more first conductive features, wherein the one or more openings are formed by a first etch process in a first process chamber, exposing the one or more openings to a second etch process in a second process chamber so that the shape of the or more openings is elongated, and filling the one or more openings with a conductive material.

20 Claims, 21 Drawing Sheets

(51) Int. Cl.
*H01L 21/768* (2006.01)
*H10D 64/01* (2025.01)

(52) U.S. Cl.
CPC .. *H01L 21/76831* (2013.01); *H01L 21/76877* (2013.01); *H10D 64/017* (2025.01)

(58) Field of Classification Search
CPC ......... H01L 21/76877; H01L 21/76825; H01L 21/31116; H01L 21/76897; H01L 21/76816; H01L 21/31144; H01L 21/76804; H01L 21/76834; H10D 64/017; H10D 30/62; H10D 30/797; H10D 62/82; H10D 62/822; H10D 30/024; H10D 30/6219; H10D 84/0158; H10D 84/038; H10D 84/0186; H10D 84/0193
See application file for complete search history.

(56) References Cited

U.S. PATENT DOCUMENTS

| | | | |
|---|---|---|---|
| 9,105,490 B2 | 8/2015 | Wang et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1* | 12/2016 | Chang | H10D 84/038 |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 10,847,417 B1* | 11/2020 | Yao | H01L 21/31111 |
| 11,043,394 B1* | 6/2021 | Hautala | H01J 37/32357 |
| 11,942,364 B2* | 3/2024 | Tien | H01L 21/76811 |
| 2015/0303118 A1* | 10/2015 | Wang | H10D 84/0151 257/401 |
| 2019/0355731 A1* | 11/2019 | Shih | H01L 21/3085 |
| 2021/0020499 A1* | 1/2021 | Gilchrist | H01L 21/26586 |
| 2021/0134660 A1 | 5/2021 | Wang et al. | |
| 2021/0272896 A1* | 9/2021 | Lin | H10B 61/00 |
| 2024/0047217 A1* | 2/2024 | Yeh | H01L 21/76816 |

FOREIGN PATENT DOCUMENTS

| | | |
|---|---|---|
| TW | 201830578 A | 8/2018 |
| TW | 202135233 A | 9/2021 |

* cited by examiner

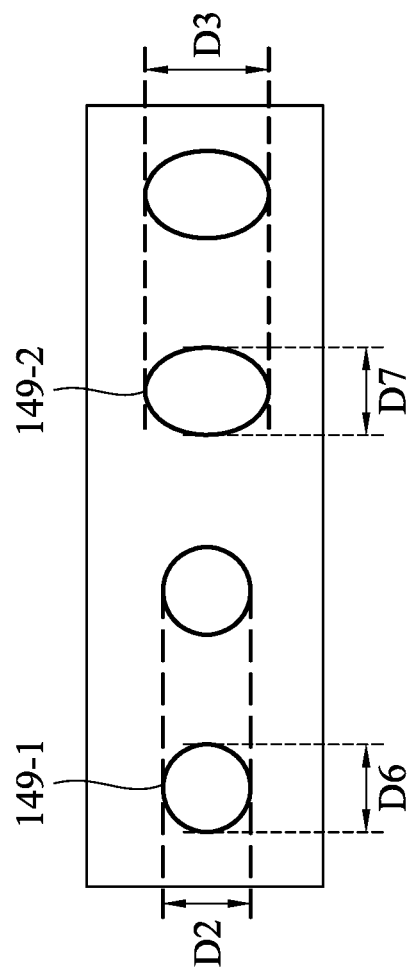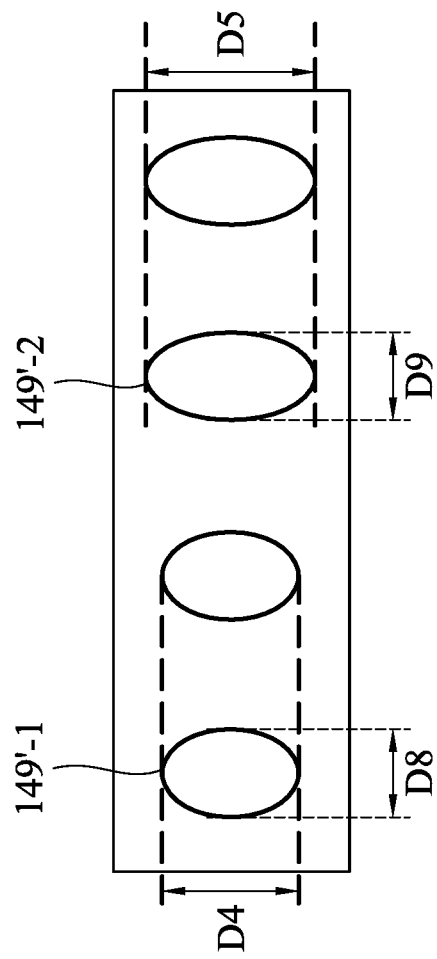
FIG. 18-1
FIG. 18-2

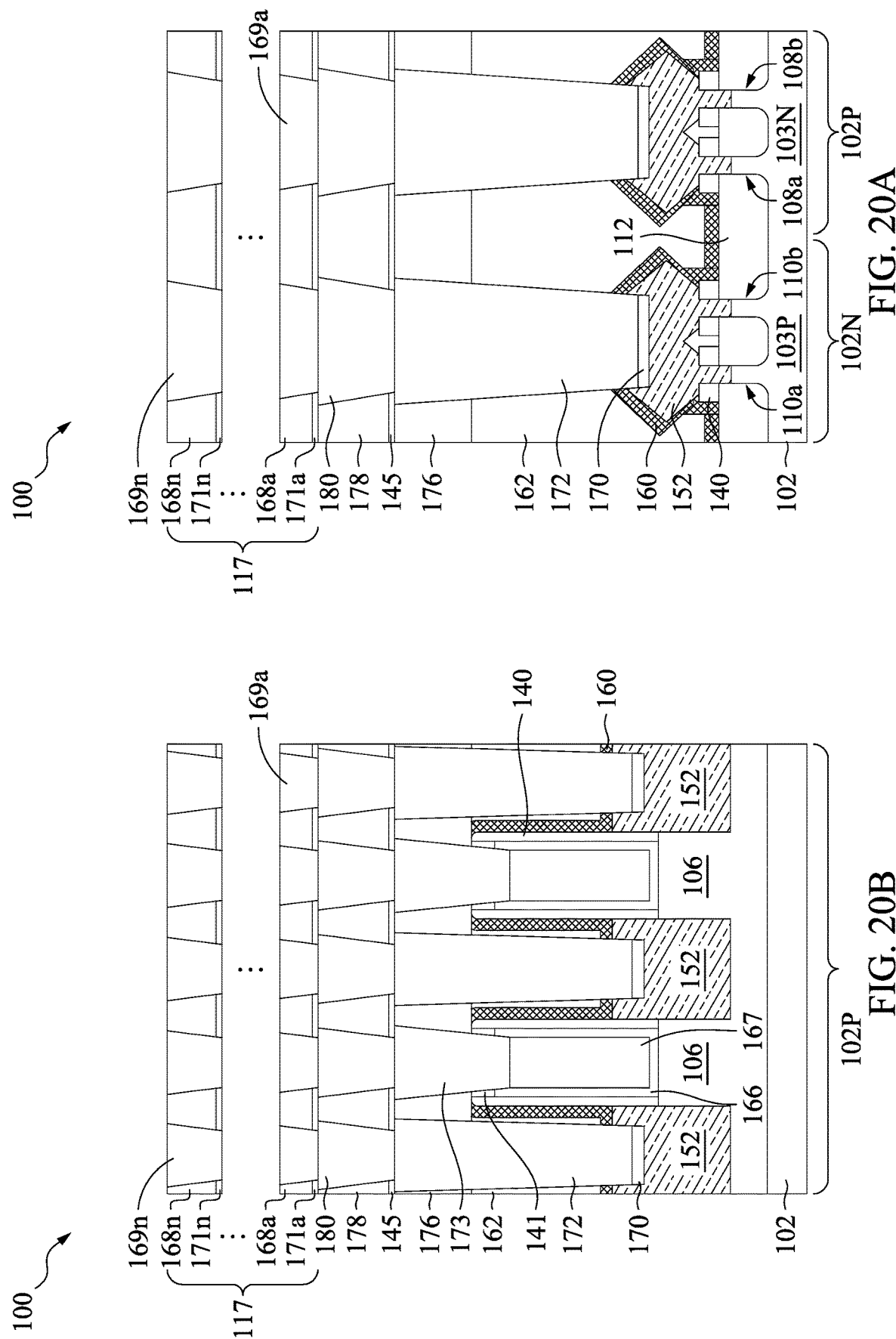

SEMICONDUCTOR DEVICE STRUCTURE AND METHODS OF FORMING THE SAME

CROSS-REFERENCE TO RELATED APPLICATIONS

This application claims priority to U.S. Provisional Application Ser. No. 63/414,538 filed Oct. 9, 2022, which is incorporated by reference in its entirety.

BACKGROUND

As the semiconductor industry has progressed into nanometer technology process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in which channel and source/drain regions are formed. A gate is formed over and along the sides of the fin structure (e.g., wrapping) utilizing the advantage of the increased surface area of the channel to produce faster, more reliable, and better-controlled semiconductor transistor devices. However, with the decreasing in scaling, the critical dimension (CD) between adjacent contact features becomes smaller. To achieve high performance of integrated circuits (ICs), the higher resistance due to the smaller CD to neighboring metal features in the bank-end-of-line (BEOL) has become a critical issue.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-20A are cross-sectional side views of various stages of manufacturing the semiconductor device structure of FIG. 4 taken along cross-section A-A, in accordance with some embodiments.

FIGS. 5B-20B are cross-sectional side views of various stages of manufacturing the semiconductor device structure of FIG. 4 taken along cross-section B-B, in accordance with some embodiments.

FIG. 17B-1 is an enlarged view of a portion of the semiconductor device structure being etched in accordance with some embodiments.

FIG. 18-1 illustrates a top view of a portion of the third ILD showing the profile of the via contact opening prior to the reactive ion beam etch process.

FIG. 18-2 illustrates a top view of a portion of the third ILD showing the profile of the via contact openings after the reactive ion beam etch process in accordance with some embodiments.

DETAILED DESCRIPTION

Figure 1:
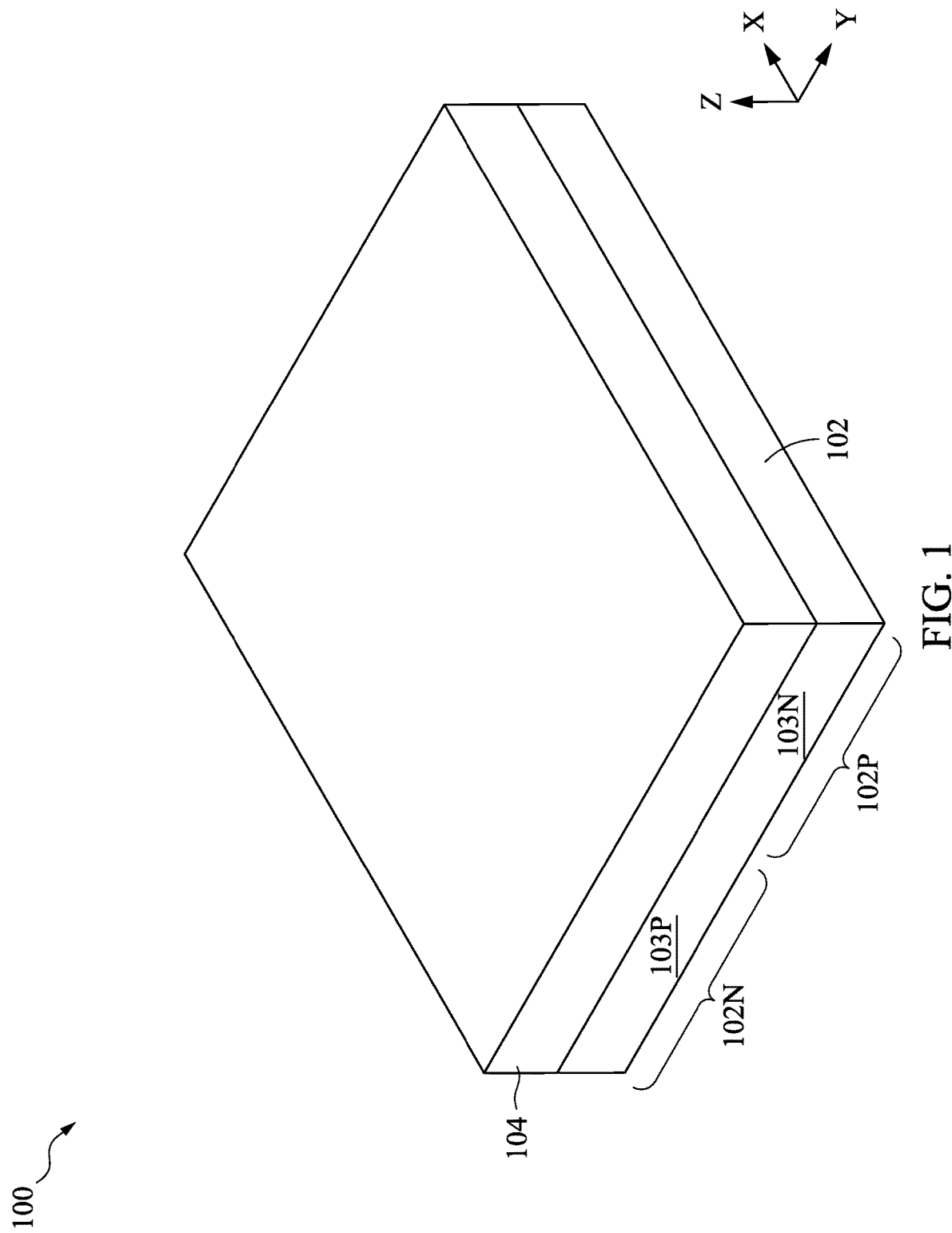
FIGS. 1-4 are perspective views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-20B illustrate various stages of manufacturing a semiconductor device structure 100 in accordance with various embodiments of this disclosure. It is understood that additional operations can be provided before, during, and after processes shown by FIGS. 1-20B and some of the operations described below can be replaced or eliminated, for additional embodiments of the method. The order of the operations/processes may be interchangeable.

FIGS. 1-4 are perspective views of various stages of manufacturing a semiconductor device structure 100, in accordance with some embodiments. In FIG. 1, a first semiconductor layer 104 is formed on a substrate 102. The substrate may be a part of a chip in a wafer. In some embodiments, the substrate 102 is a bulk semiconductor substrate, such as a semiconductor wafer. For example, the substrate 102 is a silicon wafer. The substrate 102 may include silicon or another elementary semiconductor material such as germanium. In some other embodiments, the substrate 102 includes a compound semiconductor. The compound semiconductor may include gallium arsenide, silicon carbide, indium arsenide, indium phosphide, another suitable semiconductor material, or a combination thereof. In some embodiments, the substrate 102 is a semiconductor-on-insulator (SOI) substrate. The SOI substrate may be fabricated using a separation by implantation of oxygen (SIMOX) process, a wafer bonding process, another applicable method, or a combination thereof.

The substrate 102 may be doped with P-type or N-type impurities. As shown in FIG. 1, the substrate 102 has a P-type region 102P and an N-type region 102N adjacent to the P-type region 102P, and the P-type region 102P and N-type region 102N belong to a continuous substrate 102, in accordance with some embodiments. In some embodiments of the present disclosure, the P-type region 102P is used to form a PMOS device thereon, whereas the N-type region 102N is used to form an NMOS device thereon. In some embodiments, an N-well region 103N and a P-well region 103P are formed in the substrate 102, as shown in FIG. 1. For example, the N-well region 103N may be formed in the substrate 102 in the P-type region 102P, whereas the P-well region 103P may be formed in the substrate 102 in the N-type region 102N. The P-well region 103P and the N-well region 103N may be formed by any suitable technique, for example, by separate ion implantation processes in some embodiments. By using two different implantation mask layers (not shown), the P-well region 103P and the N-well region 103N can be sequentially formed in different ion implantation processes.

The first semiconductor layer 104 is deposited over the substrate 102, as shown in FIG. 1. The first semiconductor layer 104 may be made of any suitable semiconductor material, such as silicon, germanium, III-V semiconductor material, or combinations thereof. In one exemplary embodiment, the first semiconductor layer 104 is made of silicon. The first semiconductor layer 104 may be formed by an epitaxial growth process, such as metal-organic chemical vapor deposition (MOCVD), metal-organic vapor phase epitaxy (MOVPE), plasma-enhanced chemical vapor deposition (PECVD), remote plasma chemical vapor deposition (RP-CVD), molecular beam epitaxy (MBE), hydride vapor phase epitaxy (HYPE), liquid phase epitaxy (LPE), chloride vapor phase epitaxy (Cl-VPE), or any other suitable process.

Figure 2:
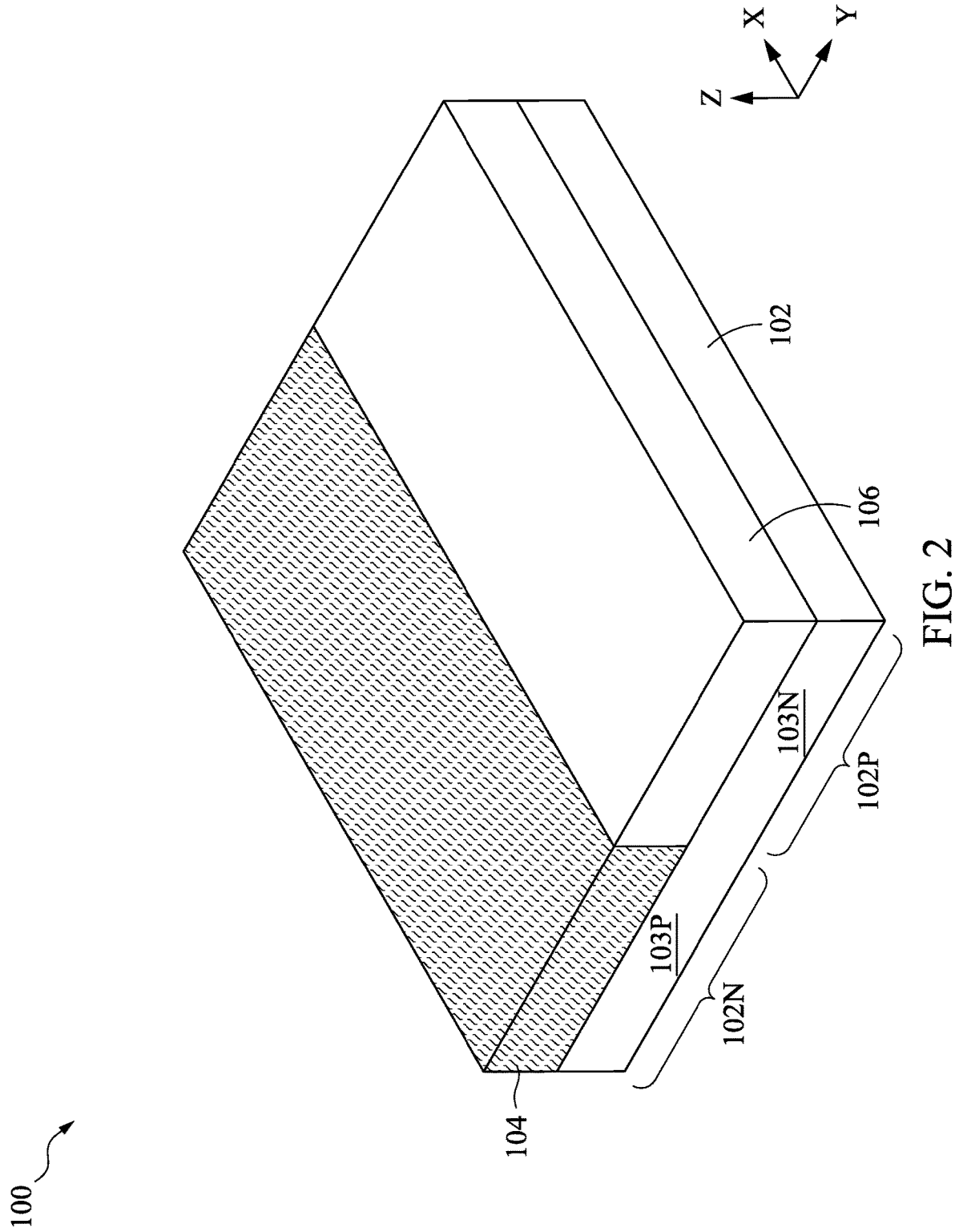

In FIG. 2, the portion of the first semiconductor layer 104 disposed over the N-well region 103N is removed, and a second semiconductor layer 106 is formed over the N-well region 103N and adjacent the portion of the first semiconductor layer 104 disposed over the P-well region 103P. A patterned mask layer (not shown) may be first formed on the portion of the first semiconductor layer 104 disposed over the P-well region 103P, and the portion of the first semiconductor layer 104 disposed over the N-well region 103N may be exposed. A removal process, such as a dry etch, wet etch, or a combination thereof, may be performed to remove the portion of the first semiconductor layer 104 disposed over the N-well region 103N, and the N-well region 103N may be exposed. The removal process does not substantially affect the mask layer (not shown) formed on the portion of the first semiconductor layer 104 disposed over the P-well region 103P, which protects the portion of the first semiconductor layer 104 disposed over the P-well region 103P. Next, the second semiconductor layer 106 is formed on the exposed N-well region 103N. The second semiconductor layer 106 may be made of any suitable semiconductor material, such as silicon, germanium, III-V semiconductor material, or combinations thereof. In one exemplary embodiment, the second semiconductor layer 106 is made of silicon germanium. The second semiconductor layer 106 may be formed by the same process as the first semiconductor layer 104. For example, the second semiconductor layer 106 may be formed on the exposed N-well region 103N by an epitaxial growth process, which does not form the second semiconductor layer 106 on the mask layer (not shown) disposed on the first semiconductor layer 104. As a result, the first semiconductor layer 104 is disposed over the P-well region 103P in the N-type region 102N, and the second semiconductor layer 106 is disposed over the N-well region 103N in the P-type region 102P.

Portions of the first semiconductor layer 104 may serve as channels in the subsequently formed NMOS device in the N-type region 102N. Portions of the second semiconductor layer 106 may serve as channels in the subsequently formed PMOS device in the P-type region 102P. In some embodiments, the NMOS device and the PMOS device are FinFETs. While embodiments described in this disclosure are described in the context of FinFETs, implementations of some aspects of the present disclosure may be used in other processes and/or in other devices, such as planar FETs, dual-gate FETs, tri-gate FETS, nanosheet channel FETs, forksheet FETs, Horizontal Gate All Around (HGAA) FETs, Vertical Gate All Around (VGAA) FETs, complementary FETs, negative-capacitance FETs, and other suitable devices.

Figure 3:
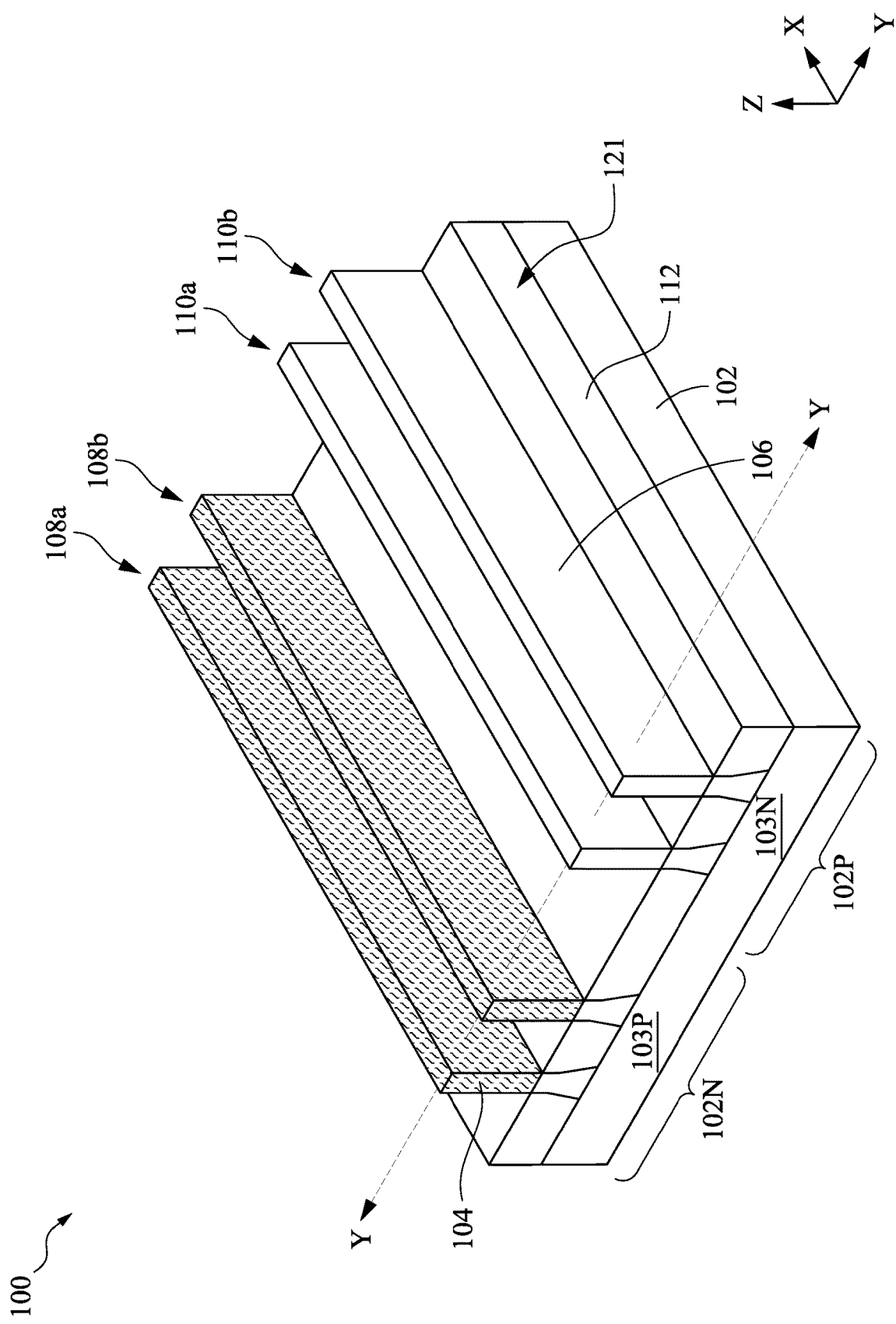

In FIG. 3, a plurality of fins 108a, 108b, 110a, 110b are formed from the first and second semiconductor layers 104, 106, respectively, and STI regions 121 are formed. The fins 108a, 108b, 110a, 110b may be patterned by any suitable method. For example, the fins 108a, 108b, 110a, 110b may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer (not shown) is formed over a substrate and patterned using a photolithography process. Spacers (not shown) are formed alongside the patterned sacrificial layer using a self-aligned process. The sacrificial layer is then removed, and the remaining spacers may then be used to pattern the substrate and form the fins.

The fins 108a, 108b may each include the first semiconductor layer 104, and a portion of the first semiconductor layer 104 may serve as an NMOS channel. Each fin 108a, 108b may also include the P-well region 103P. Likewise, the fins 110a, 110b may each include the second semiconductor layer 106, and a portion of the second semiconductor layer 106 may serve as a PMOS channel. Each fin 110a, 110b may also include the N-well region 103N. A mask (not shown) may be formed on the first and second semiconductor layers 104, 106, and may remain on the fins 108a-b and 110a-b.

Once the fins 108a-b, 110a-b are formed, an insulating material 112 is formed between adjacent fins 108a-b, 110a-b. The insulating material 112 may be first formed between adjacent fins 108a-b, 110a-b and over the fins 108a-b, 110a-b, so the fins 108a-b, 110a-b are embedded in the insulating material 112. A planarization process, such as a chemical-mechanical polishing (CMP) process may be performed to expose the top of the fins 108a-b, 110a-b. In some embodiments, the planarization process exposes the top of the mask (not shown) disposed on the fins 108a-b and 110a-b. The insulating material 112 are then recessed by removing a portion of the insulating material 112 located on both sides of each fin 108a-b, 110a-b. The insulating material 112 may be recessed by any suitable removal process, such as dry etch or wet etch that selectively removes the insulating material 112 but does not substantially affect the semiconductor materials of the fins 108a-b, 110a-b. The insulating material 112 may include an oxygen-containing material, such as silicon oxide, carbon or nitrogen doped oxide, or fluorine-doped silicate glass (FSG); a nitrogen-containing material, such as silicon nitride, silicon oxynitride (SiON), SiOCN, SiCN; a low-K dielectric material (e.g., a material having a K value lower than that of silicon dioxide); or any suitable dielectric material. The insulating material 112 may be formed by any suitable method, such as low-pressure chemical vapor deposition (LPCVD), plasma enhanced CVD (PECVD) or flowable CVD (FCVD). The insulating material 112 may be shallow trench isolation (STI) region, and is referred to as STI region 121 in this disclosure.

In some alternative embodiments, instead of forming first and second semiconductor layers 104, 106 over the substrate 102, the fins 108a-b, 110a-b may be formed by first forming isolation regions (e.g., STI regions 121) on a bulk substrate (e.g., substrate 102). The formation of the STI regions may include etching the bulk substrate to form trenches, and filling the trenches with a dielectric material to form the STI regions. The portions of the substrate between neighboring STI regions form the fins. The top surfaces of the fins and the top surfaces of the STI regions may be substantially level with each other by a CMP process. After the STI regions are formed, at least top portions of, or substantially entireties of, the fins are removed. Accordingly, recesses are formed between STI regions. The bottom surfaces of the STI regions may be level with, higher, or lower than the bottom surfaces of the STI regions. An epitaxy is then performed to separately grow first and second semiconductor layers (e.g., first and second semiconductor layers 104, 106) in the recesses created as a result of removal of the portions of the fins, thereby forming fins (e.g., fins 108a-b, 110a-b). A CMP is then performed until the top surfaces of the fins and the top surfaces of the STI regions are substantially co-planar. In some embodiments, after the epitaxy and the CMP, an implantation process is performed to define well regions (e.g., P-well region 103P and N-well region 103N) in the substrate. Alternatively, the fins are in-situ doped with impurities (e.g., dopants having P-type or N-type conductivity) during the epitaxy. Thereafter, the STI regions are recessed so that fins of first and second semiconductor layers (e.g., fins 108a-b, 110a-b) are extending upwardly over the STI regions from the substrate, in a similar fashion as shown in FIG. 3.

In some alternative embodiments, one of the fins 108a-b (e.g., fin 108a) in the N-type region 102N is formed of the second semiconductor layer 106, and the other fin 108b in the N-type region 102N is formed of the first semiconductor layer 104. In such cases, the subsequent S/D epitaxial features 152 formed on the fins 108a and 108b in the N-type region 102N may be Si or SiP; the subsequent S/D epitaxial features 152 formed on the fins 110a and 110b in the P-type region 102P may be SiGe. In some alternative embodiments, the fins 108a-b and 110a-b are formed directly from a bulk substrate (e.g., substrate 102), which may be doped with P-type or N-type impurities to form well regions (e.g., P-well region 103P and N-well region 103N). In such cases, the fins are formed of the same material as the substrate 102. In one exemplary embodiment, the fins and the substrate 102 are formed of silicon.

Figure 4:
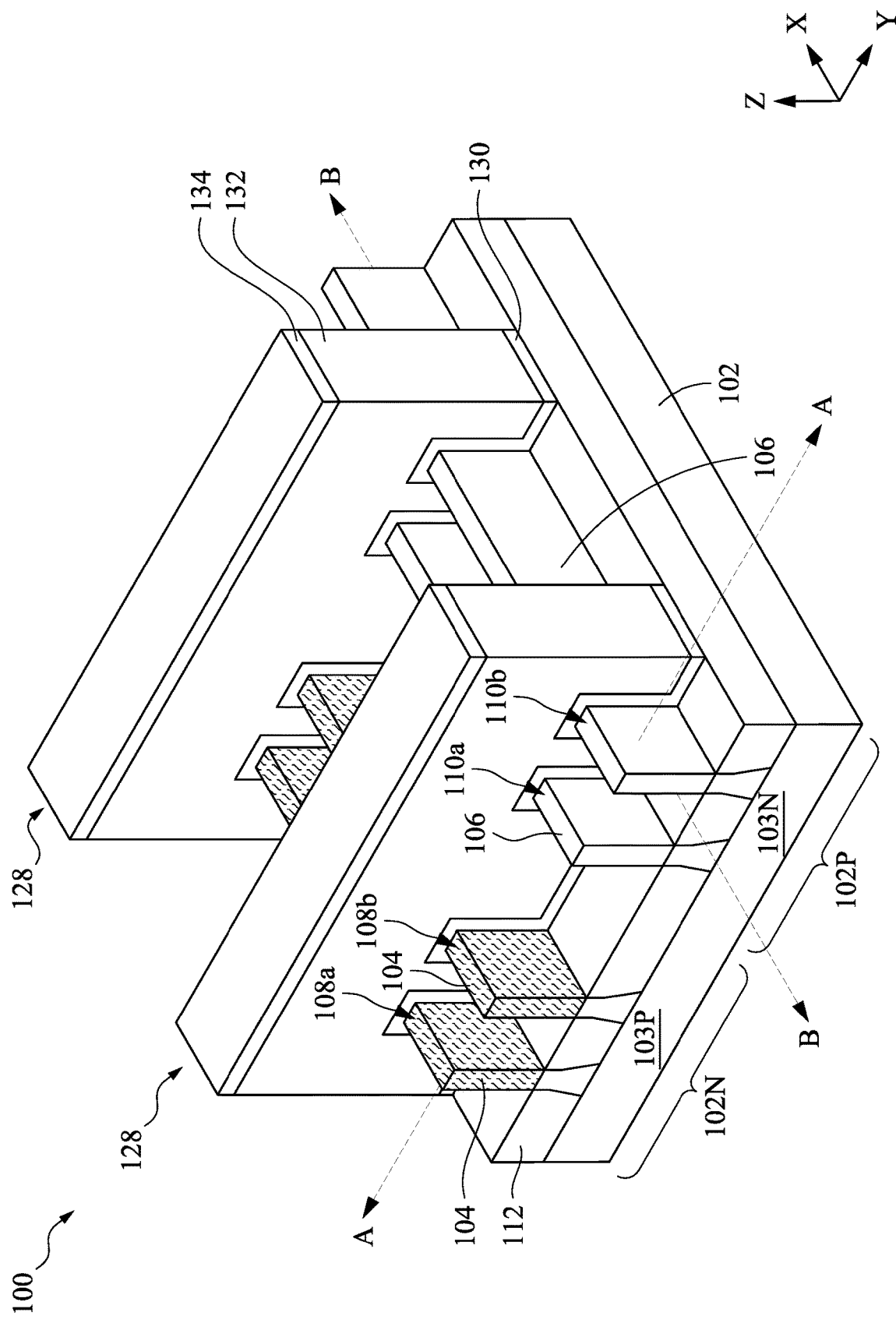

In FIG. 4, one or more sacrificial gate stacks 128 are formed on a portion of the fins 108a-b, 110a-b. Each sacrificial gate stack 128 may include a sacrificial gate dielectric layer 130, a sacrificial gate electrode layer 132, and a mask structure 134. The sacrificial gate dielectric layer 130 may include one or more layers of dielectric material, such as $SiO_2$, SiN, a high-K dielectric material, and/or other suitable dielectric material. In some embodiments, the sacrificial gate dielectric layer 130 may be deposited by a CVD process, an ALD process, a PVD process, or other suitable process. The sacrificial gate electrode layer 132 may include polycrystalline silicon (polysilicon). The mask structure 134 may include an oxygen-containing layer and a nitrogen-containing layer. In some embodiments, the sacrificial gate electrode layer 132 and the mask structure 134 are formed by various processes such as layer deposition, for example, CVD (including both LPCVD and PECVD), PVD, ALD, thermal oxidation, e-beam evaporation, or other suitable deposition techniques, or combinations thereof.

The sacrificial gate stacks 128 may be formed by first depositing blanket layers of the sacrificial gate dielectric layer 130, the sacrificial gate electrode layer 132, and the mask structure 134, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch, wet etch, other etch methods, and/or combinations thereof. By patterning the sacrificial gate stacks 128, the fins 108a-b, 110a-b are partially exposed on opposite sides of the sacrificial gate stacks 128. While two sacrificial gate stacks 128 are shown in FIG. 4, it can be appreciated that they are for illustrative purpose only and any number of the sacrificial gate stacks 128 may be formed.

FIGS. 5A-20A are cross-sectional side views of various stages of manufacturing the semiconductor device structure 100 of FIG. 4 taken along cross-section A-A, in accordance with some embodiments. FIGS. 5B-20B are cross-sectional side views of various stages of manufacturing the semiconductor device structure 100 of FIG. 4 taken along cross-section B-B, in accordance with some embodiments. Cross-section B-B is in a plane of the fin 110b along the X direction. Cross-section A-A is in a plane perpendicular to cross-section B-B and is in the S/D epitaxial features 152 (FIG. 6A) along the Y-direction.

Figure 5A:
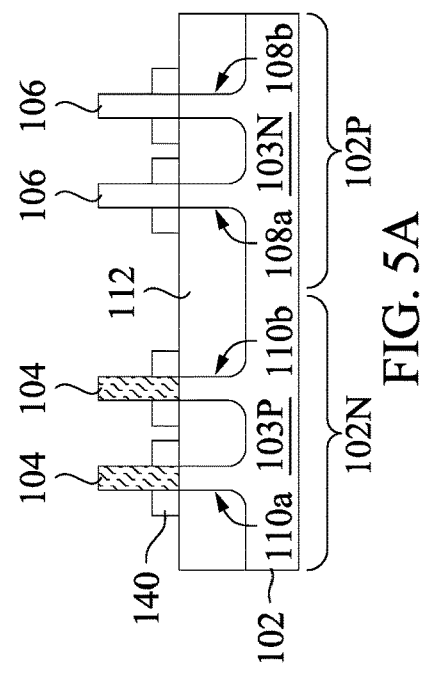
Figure 5B:
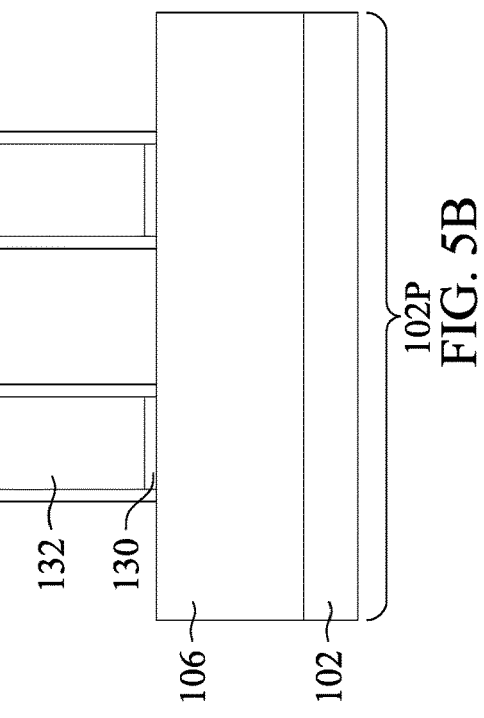

In FIGS. 5A-5B, a gate spacer 140 is formed on the sacrificial gate structures 128 and the exposed portions of the first and second semiconductor layers 104, 106. The gate spacer 140 may be conformally deposited on the exposed surfaces of the semiconductor device structure 100. The conformal gate spacer 140 may be formed by ALD or any suitable processes. An anisotropic etch is then performed on the gate spacer 140 using, for example, reactive ion etching (RIE). During the anisotropic etch process, most of the gate spacer 140 is removed from horizontal surfaces, such as tops of the sacrificial gate structures 128 and tops of the fins 108a-b, 110a-b, leaving the gate spacer 140 on the vertical surfaces, such as on opposite sidewalls of the sacrificial gate structures 128. The gate spacers 140 may partially remain on opposite sidewalls of the fins 108a-b, 110a-b, as shown in FIG. 5A. In some embodiments, the gate spacers 140 formed on the source/drain regions of the fins 108a-b, 110a-b are fully removed.

The gate spacer 140 may be made of a dielectric material such as silicon oxide ($SiO_2$), silicon nitride ($Si_3N_4$), silicon carbide (SiC), silicon oxynitride (SiON), silicon carbonnitride (SiCN), silicon oxycarbide (SiOC), silicon oxycarbonitride (SiOCN), air gap, and/or any combinations thereof. In some embodiments, the gate spacer 140 include one or more layers of the dielectric material discussed herein.

Figure 6A:
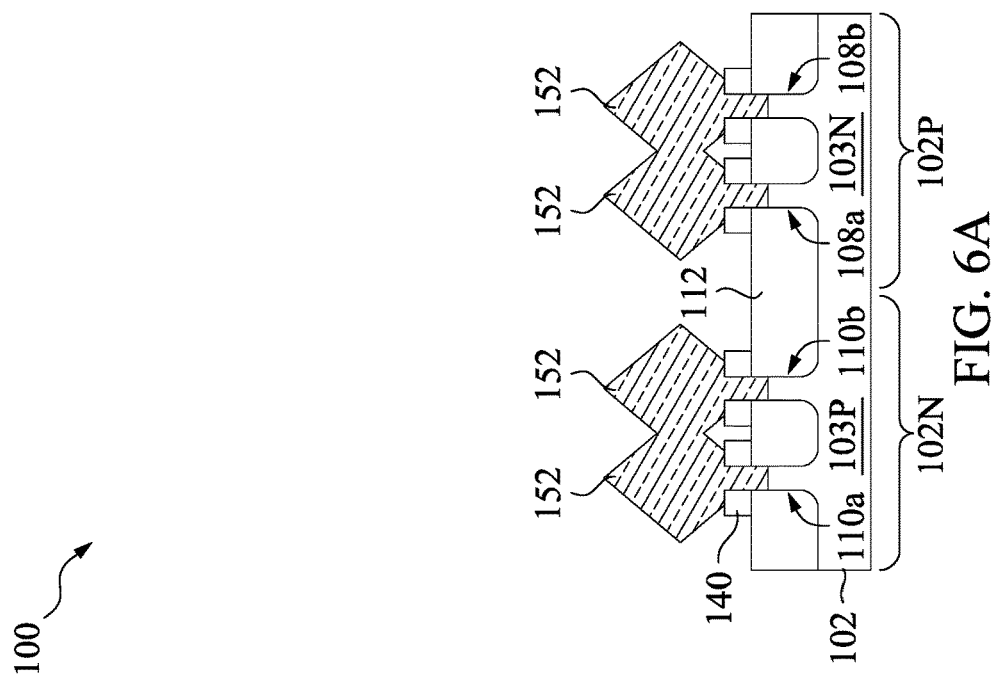
Figure 6B:
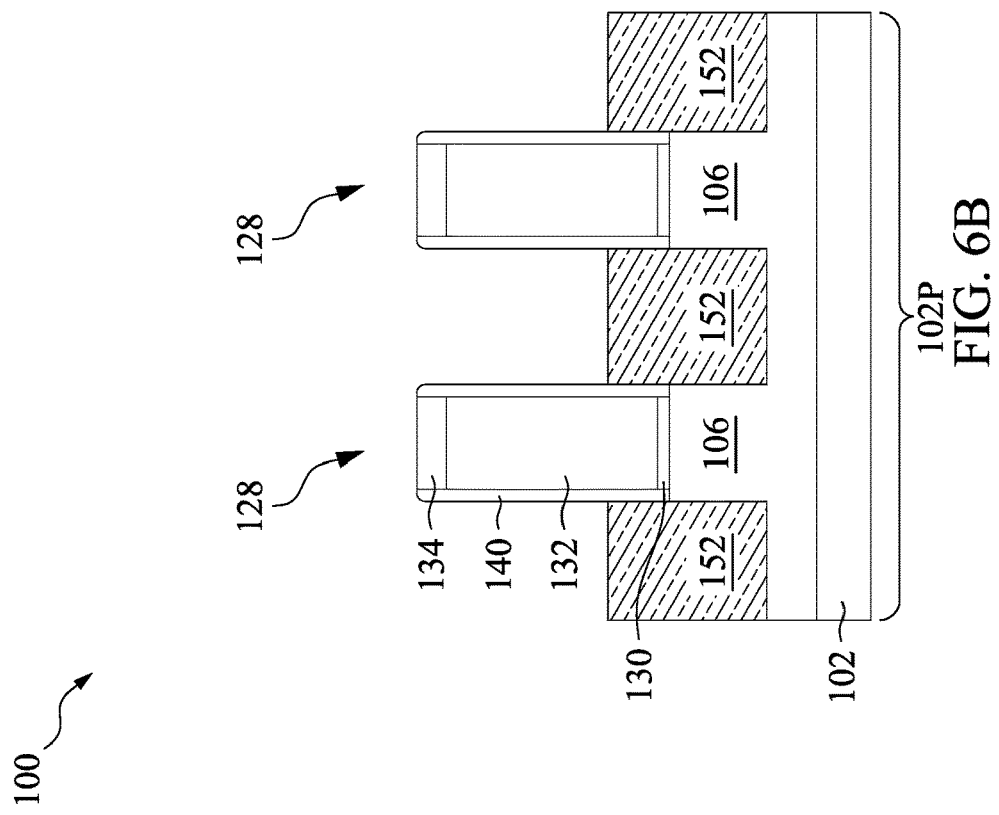

In FIGS. 6A-6B, the first and second semiconductor layers 104, 106 of the fins 108a-b, 110a-b not covered by the sacrificial gate structures 128 and the gate spacers 140 are recessed, and source/drain (S/D) epitaxial features 152 are formed. For N-channel FETs, the epitaxial S/D features 152 may include one or more layers of Si, SiP, SiC, SiCP, or a group III-V material (InP, GaAs, AlAs, InAs, InAlAs, InGaAs). In some embodiments, the epitaxial S/D features 152 may be doped with N-type dopants, such as phosphorus (P), arsenic (As), etc, for N-type devices. For P-channel FETs, the epitaxial S/D features 152 may include one or more layers of Si, SiGe, SiGeB, Ge, or a group III-V material (InSb, GaSb, InGaSb). In some embodiments, the epitaxial S/D features 152 may be doped with P-type dopants, such as boron (B). The epitaxial S/D features 152 may grow both vertically and horizontally to form facets, which may correspond to crystalline planes of the material used for the substrate 102. The epitaxial S/D features 152 may be formed by an epitaxial growth method using CVD, ALD or MBE.

In some embodiments, the portions of the first semiconductor layer 104 on both sides of each sacrificial gate structure 128 are completely removed, and the S/D epitaxial features 152 are formed on the P-well region 103P of the fins 108a-b. The S/D epitaxial features 152 may grow both vertically and horizontally to form facets, which may correspond to crystalline planes of the material used for the substrate 102. In some embodiments, the S/D epitaxial features 152 of the fins 108a-108b and 110a-110b are merged, as shown in FIG. 6A. The S/D epitaxial features 152 may each have a top surface at a level higher than a top surface of the first semiconductor layer 104, as shown in FIG. 6B.

Figure 7A:
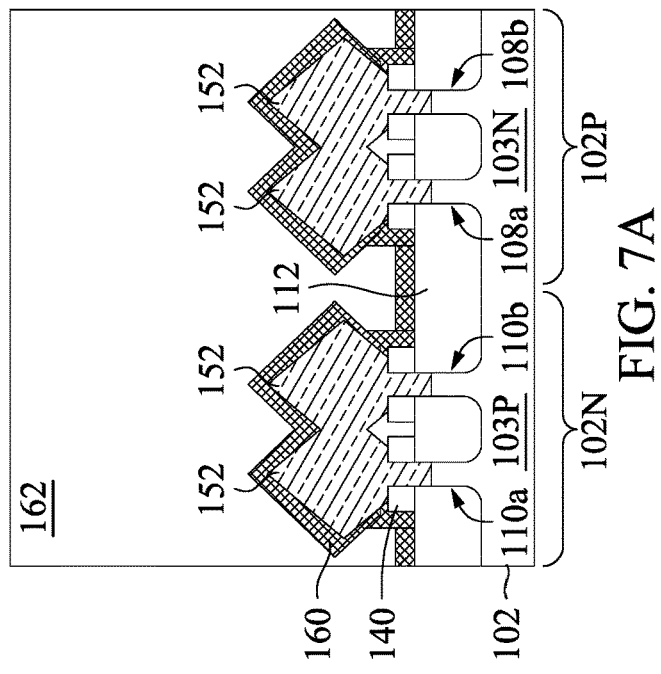
Figure 7B:
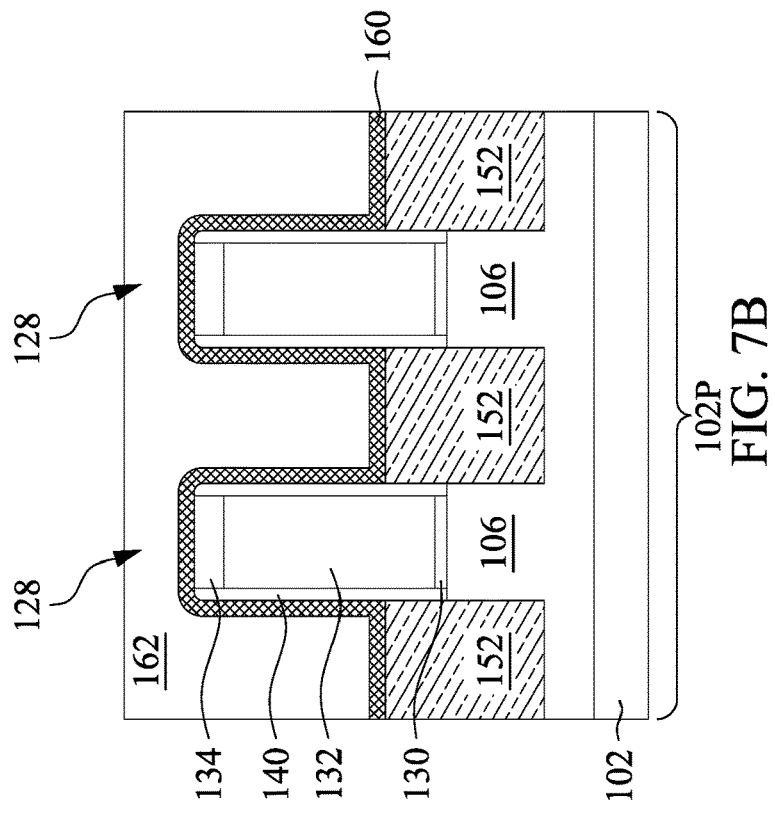

In FIGS. 7A-7B, a contact etch stop layer (CESL) 160 is conformally formed on the exposed surfaces of the semiconductor device structure 100. The CESL 160 covers the sidewalls of the sacrificial gate structures 128, the insulating material 112, and the S/D epitaxial features 152. The CESL 160 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, a first interlayer dielectric (ILD) 162 is formed on the CESL 160. The materials for the first ILD 162 may include compounds comprising Si, O, C, and/or H, such as tetraethylorthosilicate (TEOS) oxide, un-doped silicate glass, silicon oxide, or doped silicon oxide such as borophosphosilicate glass (BPSG), fused silica glass (FSG), phosphosilicate glass (PSG), boron doped silicon glass (BSG), and/or other suitable dielectric materials. The first ILD 162 may be deposited by a PECVD process or FCVD process or other suitable deposition technique. In some embodiments, after formation of the first ILD 162, the semiconductor device structure 100 may be subject to a thermal process to anneal the first ILD 162. After formation of the first ILD 162, a planarization process is performed to expose the sacrificial gate electrode layer 132. The planarization process may be any suitable process, such as a CMP process. The planarization process removes portions of the first ILD 162 and the CESL 160 disposed on the sacrificial gate structures 128. The planarization process may also remove the mask structure 134.

Figure 8A:
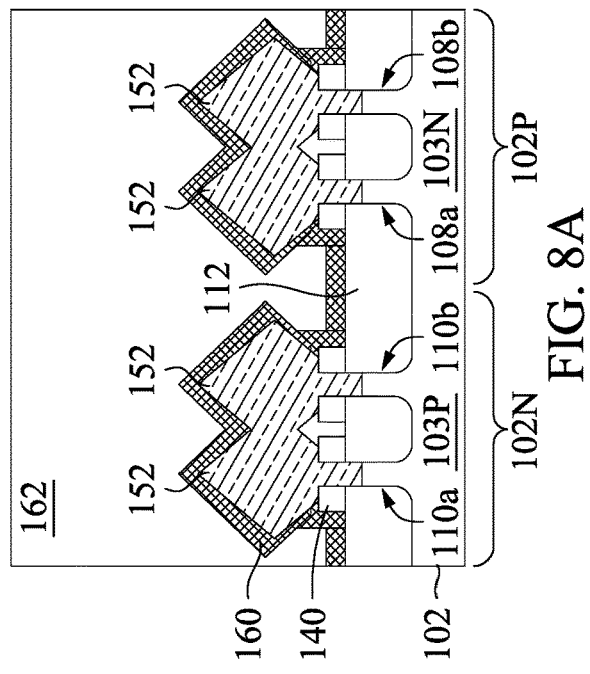
Figure 8B:
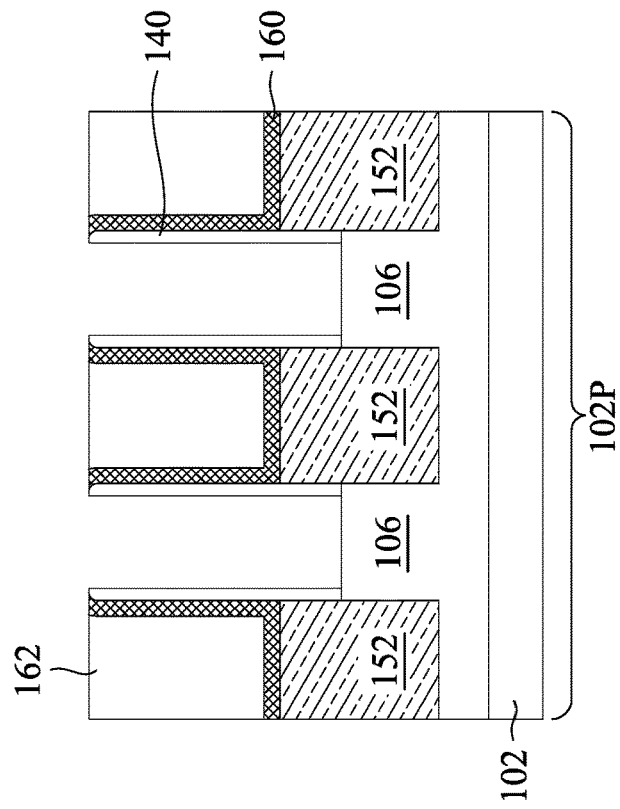

In FIGS. 8A-8B, the mask structure 134 (if not removed during previous CMP process), the sacrificial gate electrode layers 132 (FIG. 7B), and the sacrificial gate dielectric layers 130 (FIG. 7B) are removed. The sacrificial gate electrode layers 132 and the sacrificial gate dielectric layers 130 may be removed by one or more etch processes, such as dry etch process, wet etch process, or a combination thereof. The one or more etch processes selectively remove the sacrificial gate electrode layers 132 and the sacrificial gate dielectric layers 130 without substantially affects the gate spacer 140, the CESL 160, and the first ILD 162. The removal of the sacrificial gate electrode layers 132 and the sacrificial gate dielectric layers 130 exposes a top portion of the first and second semiconductor layers 104, 106 (only first semiconductor layers 104 can be seen in FIG. 8A) in the channel region.

Figure 9A:
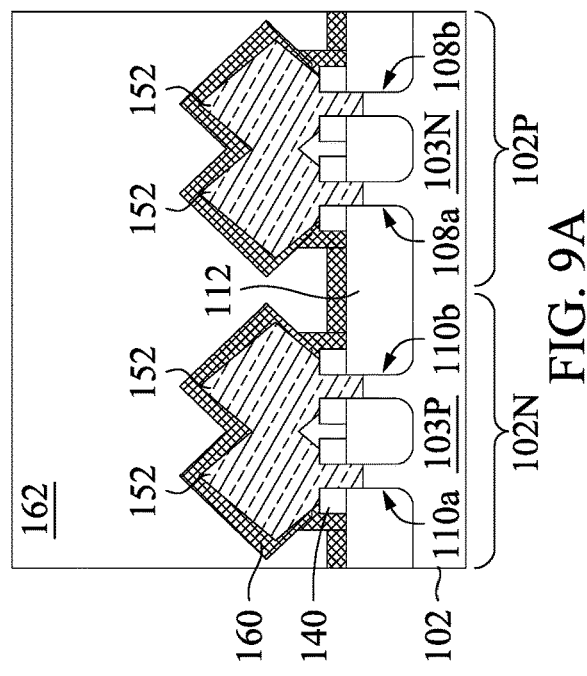
Figure 9B:
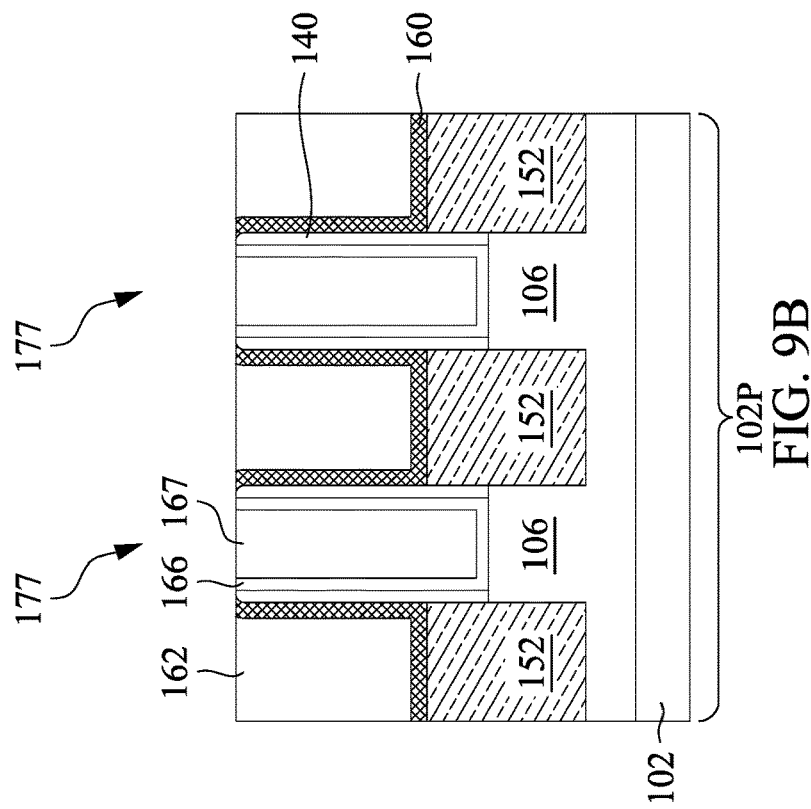

In FIGS. 9A-9B, replacement gate structures 177 are formed. The replacement gate structure 177 may include a gate dielectric layer 166 and a gate electrode layer 167 formed on the gate dielectric layer 166. The gate dielectric layer 166 may include one or more dielectric layers and may include the same material(s) as the sacrificial gate dielectric layer 130.

In some embodiments, the gate dielectric layer 166 is a high-K dielectric material such as metal oxides, metal nitrides, metal silicates, transition metal-oxides, transition metal-nitrides, transition metal-silicates, oxynitrides of metals, metal aluminates, zirconium silicate, zirconium aluminate, or any combination thereof. For example, the gate dielectric layer 166 may include hafnium oxide ($HfO_2$), hafnium silicon oxide (HfSiO), hafnium silicon oxynitride (HfSiON), hafnium tantalum oxide (HfTaO), hafnium titanium oxide (HMO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$), barium titanium oxide ($BaTiO_3$), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. In alternative embodiments, the gate dielectric layer 166 may have a multilayer structure such as one layer of silicon oxide (e.g., interfacial layer) and another layer of high-K material. In some embodiments, the gate dielectric layer 166 may be deposited by one or more ALD processes or other suitable processes.

Depending on the application and/or conductivity type of the devices in the N-type region 102N and the P-type region 102P, the gate electrode layer 167 may include one or more layers of electrically conductive material, such as polysilicon, aluminum, copper, titanium, tantalum, tungsten, cobalt, molybdenum, tantalum nitride, nickel silicide, cobalt silicide, TiN, WN, AlTi, AlTiO, AlTiC, AlTiN, TaCN, TaC, TaSiN, metal alloys, other suitable materials, and/or any combinations thereof. For devices in the N-type region 102N, the gate electrode layer 167 may be AlTiO, AlTiC, or a combination thereof. For devices in the P-type region 102P, the gate electrode layer 167 may be AlTiO, AlTiC, AlTiN, or a combination thereof. The gate electrode layers 167 may be formed by PVD, CVD, ALD, electro-plating, or other suitable method.

Figure 10A:
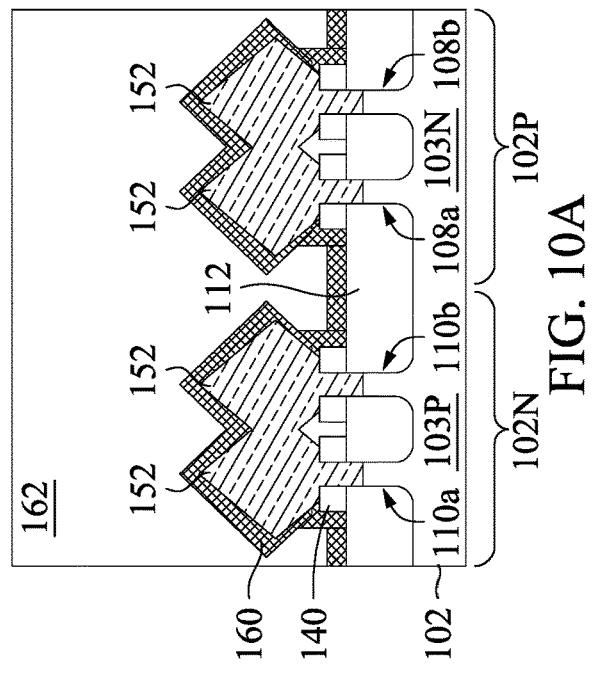
Figure 10B:
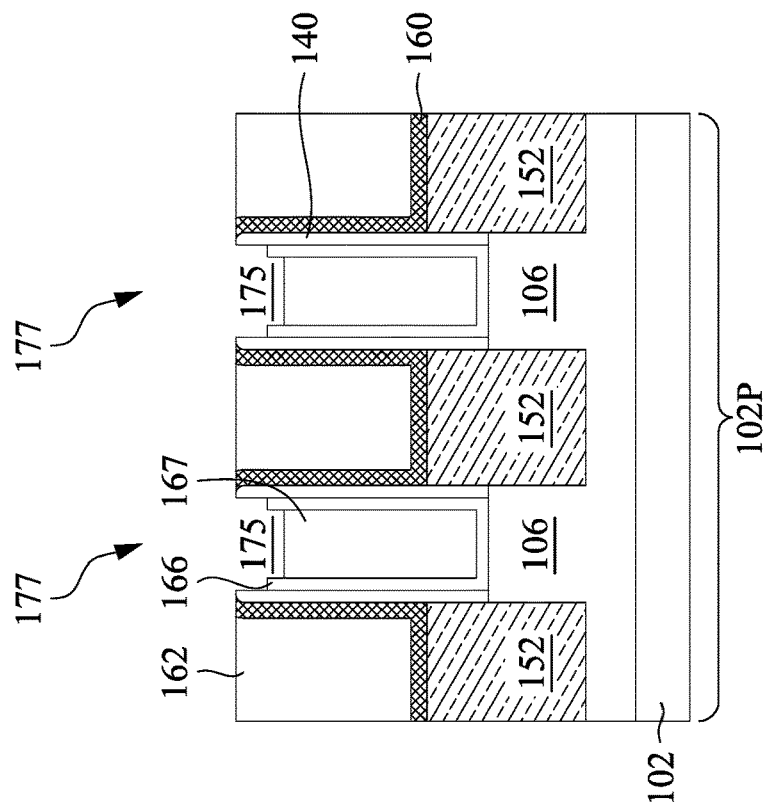

In FIGS. 10A-10B, a metal gate etching back (MGEB) process is performed to remove portions of the gate dielectric layer 166 and the gate electrode layer 167. Recesses 175 are formed in the region between neighboring gate spacers 140 as a result of the removal of the portions of the gate dielectric layer 166 and the gate electrode layer 167. The recesses 175 are defined by the exposed sidewalls of the gate spacers 140 and the recessed top surfaces of the gate electrode layers 167 and the gate dielectric layers 166, respectively. The recesses 175 allow for subsequent first dielectric cap layer 141 (FIG. 11B) to be formed therein and protect the replacement gate structures 177. The MGEB process may include one or more etching processes, which may be dry etching, wet etching, atomic layer etching (ALE), plasma etching, any suitable etching back, or a combination thereof. The one or more etching processes performed in the MGEB process are selective to materials of the replacement gate structures 177 with respect to the gate spacers 140 and the first ILD 162 so that the top surfaces of the gate electrode layers 167 and the gate dielectric layers 166, respectively, are at a level lower than top surfaces of the gate spacers 140 and the first ILD 162.

Figure 11A:
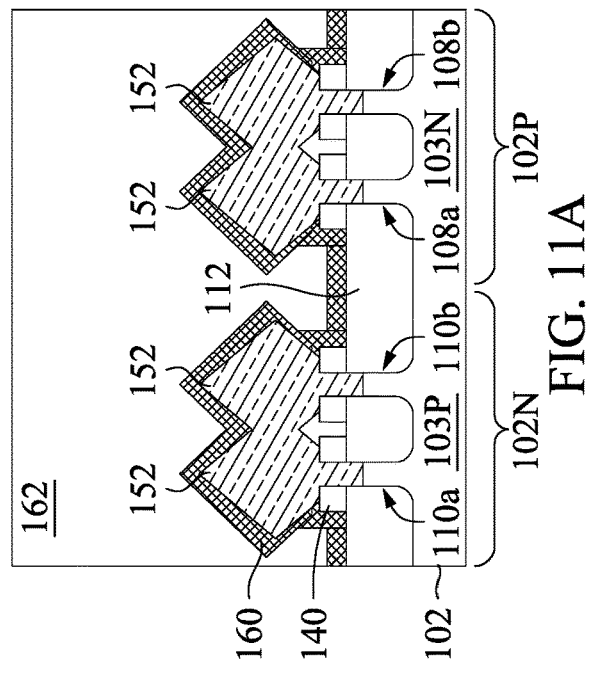
Figure 11B:
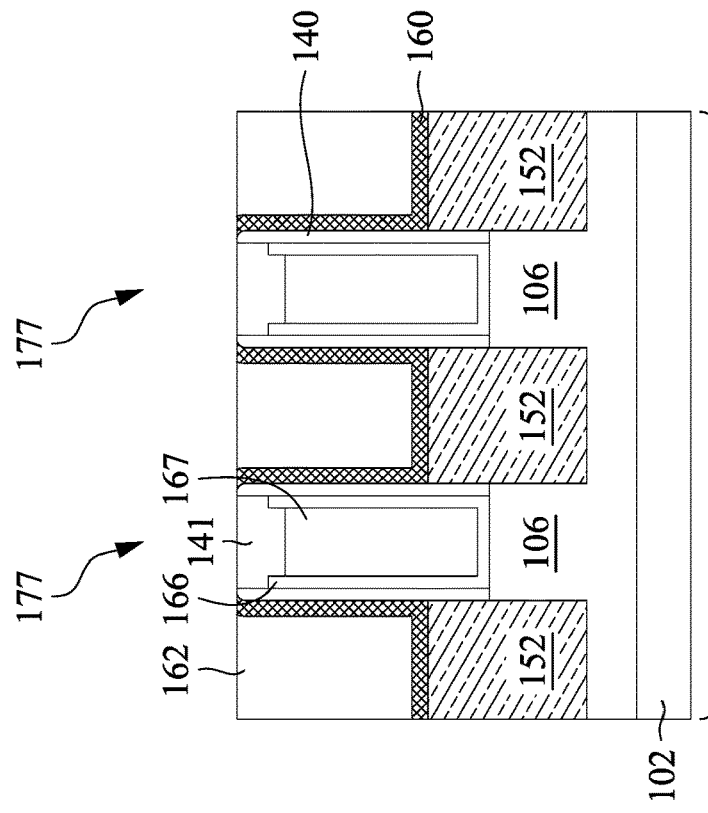

In FIGS. 11A-11B, a dielectric cap layer 141 is formed in the trenches 175 (FIG. 10B), over the replacement gate structures 177. The dielectric cap layer 141 fills in the trenches 175 and over the first ILD 162 to a pre-determined height using a deposition process, such as CVD, PECVD, or FCVD or any suitable deposition technique. A CMP process is then performed to remove excess deposition of the dielectric cap layer 141 outside the trenches 175 until the top surface of the first ILD 162 is exposed. The top surfaces of the first ILD 162, the CESL 160, the dielectric cap layer 141, and the gate spacers 140 are substantially coplanar. The dielectric cap layer 141 defines self-aligned contact (SAC) regions and thus serve as an etch stop layer during subsequent trench and via patterning for metal contacts. The dielectric cap layer 141 can be formed of any dielectric material that has different etch selectivity than the gate spacers 140, the CESL 160, and the first ILD 162. In some embodiments, the dielectric cap layer 141 may include or be formed of an oxygen-containing material, a nitrogen-containing material, or a silicon-containing material. Exemplary materials for the dielectric cap layer 141 may include, but are not limited to, SiO, HfSi, SiOC, AlO, ZrSi, AlON, ZrO, HfO, TiO, ZrAlO, ZnO, TaO, LaO, TaCN, SiN, SiOCN, Si, SiOCN, ZrN, SiCN, or any combinations thereof.

Figure 12A:
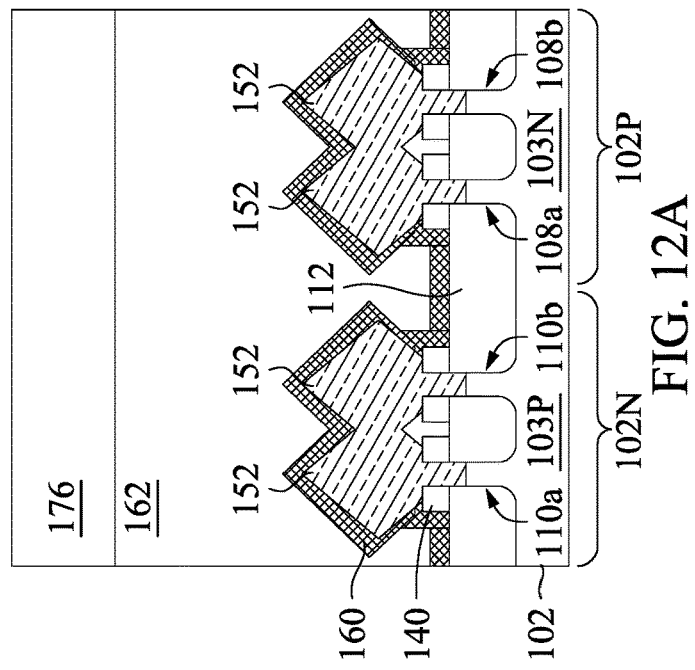
Figure 12B:
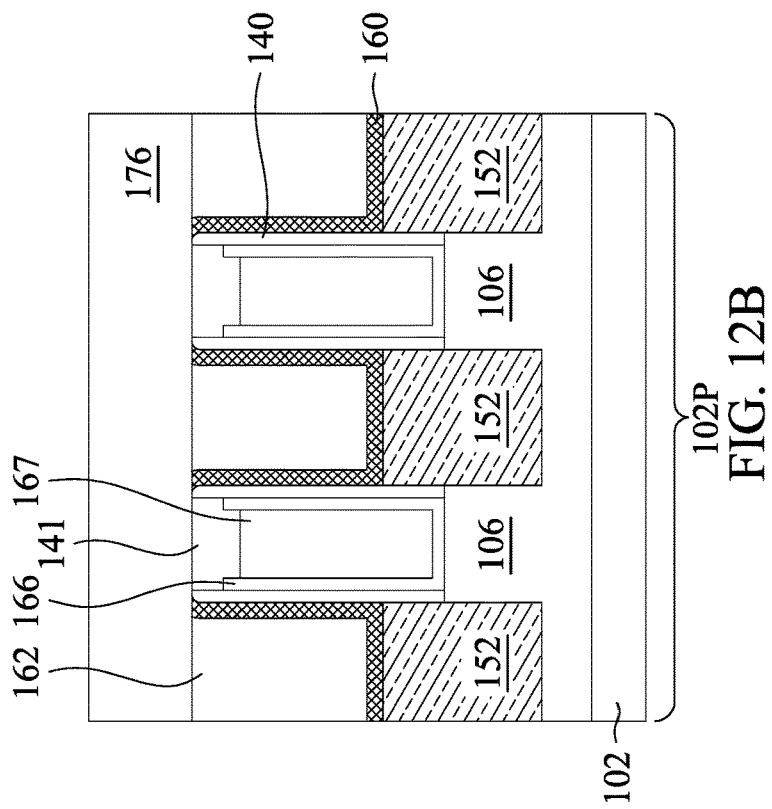

In FIGS. 12A-12B, a second ILD 176 is formed over the semiconductor device structure 100. The second ILD 176 may include the same material as the first ILD 162 and be deposited using the same fashion as the first ILD 162, as discussed above with respect to FIGS. 7A and 7B.

Figure 13A:
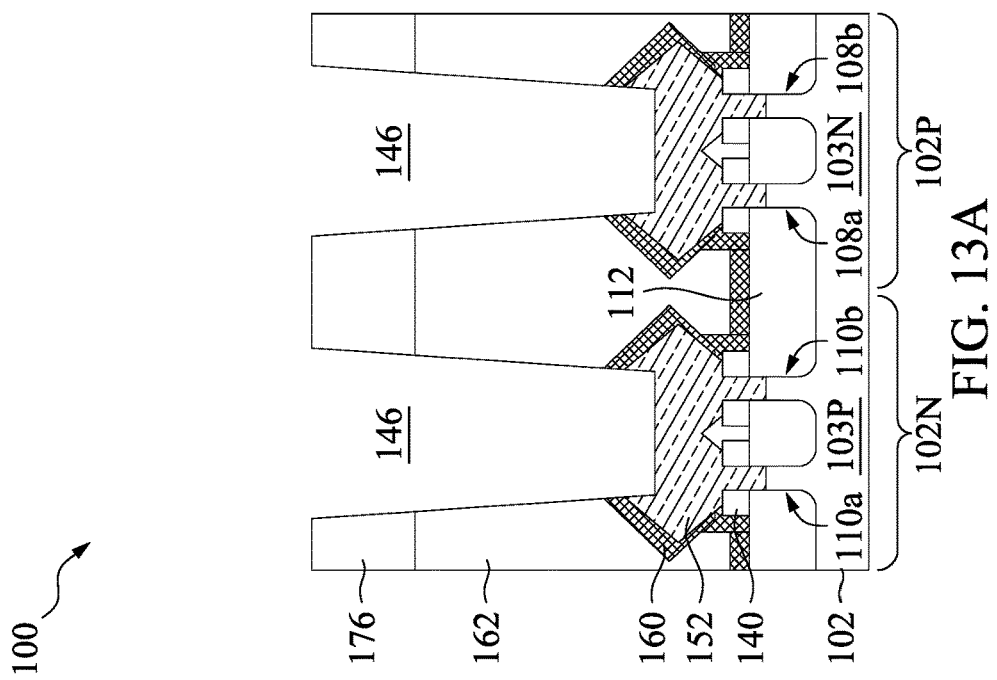
Figure 13B:
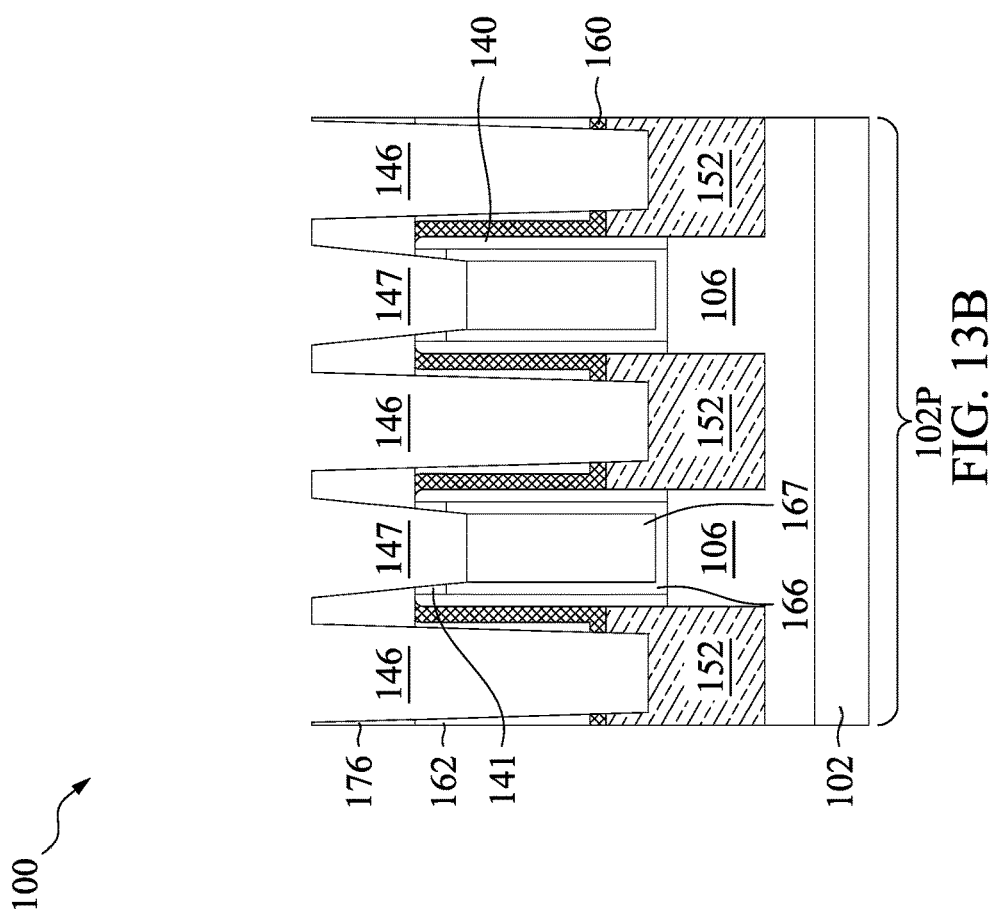

In FIGS. 13A-13B, portions of the first ILD 162 and the CESL 160 disposed on both sides of the replacement gate structures 177 are removed. The removal of the portions of the first ILD 162 and the CESL 160 forms a contact opening 146 exposing the S/D epitaxial features 152. In some embodiments, the upper portion of the exposed S/D epitaxial features 152 is removed. Portions of the first ILD 162 and the dielectric cap layer 141 over the replacement gate structures 177 are also removed. The removal of the portions of the first ILD 162 and the dielectric cap layer 141 forms a contact opening 147 exposing gate electrode layer 167. In some embodiments, the upper portion of the exposed gate electrode layer 167 is removed. The portions of the first ILD 162, the CESL 160, and dielectric cap layer 141 may be removed by one or more etch processes, such as a wet etch, dry etch, or combination thereof. In one embodiment, a first etch process may be performed to form the contact openings 146, and a second etch process may be performed to form the contact openings 147. The etchants used by the first etch process removes the first and second ILD 162, 176 and the CESL 160 without substantially affecting the dielectric cap layer 141. The etchants used by the second etch process removes the first ILD 162 and the dielectric cap layer 141 without substantially affecting the gate electrode layer 167 and the exposed S/D epitaxial features 152.

Figure 14A:
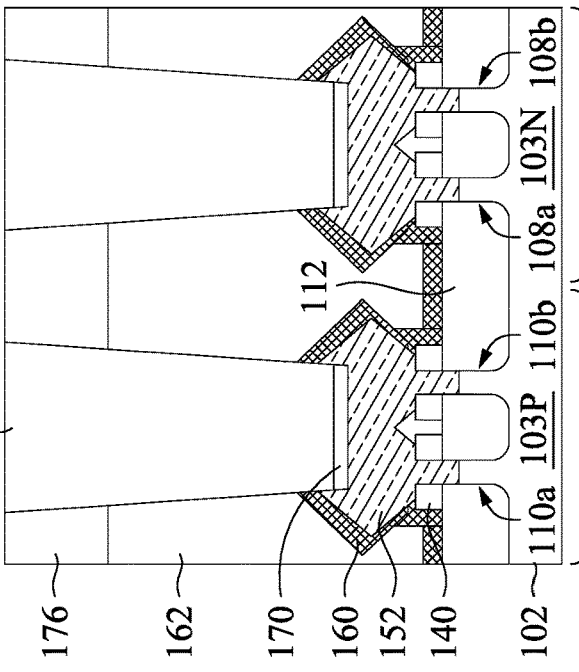
Figure 14B:
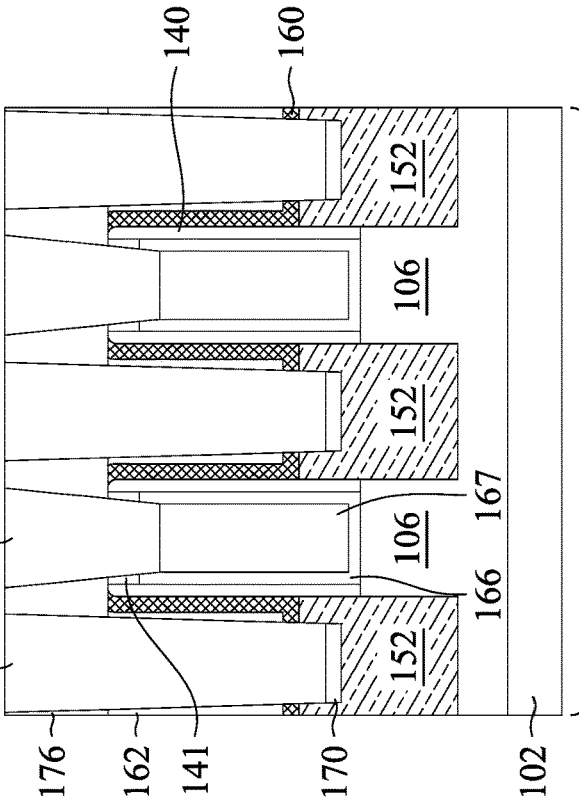

In FIGS. 14A-14B, conductive features 172 and conductive features 173 are then formed over the S/D epitaxial features 152 and the replacement gate structures 177 in the contact openings 146 and 147, respectively. The conductive features 172 may serve as S/D contacts while the conductive features 173 may serve as gate contacts. The conductive features 172, 173 may include an electrically conductive material, such as one or more of Ru, Mo, Co, Ni. W, Ti, Ta, Cu, Al, TiN and TaN. The conductive feature 172 may be formed by any suitable process, such as PVD, CVD, ALD, electrochemical plating, or other suitable method. A silicide layer 170 may be formed between the S/D epitaxial feature 152 and the conductive feature 172. The silicide layer 170 conductively couples the S/D epitaxial features 152 to the conductive feature 172. The silicide layer 170 is a metal or metal alloy silicide, and the metal may include a noble metal, a refractory metal, a rare earth metal, alloys thereof, or combinations thereof. Once the conductive features 172, 173 are formed, a planarization process, such as CMP, is performed on the semiconductor device structure 100 until the top surface of the second ILD 176 is exposed.

Figure 15A:
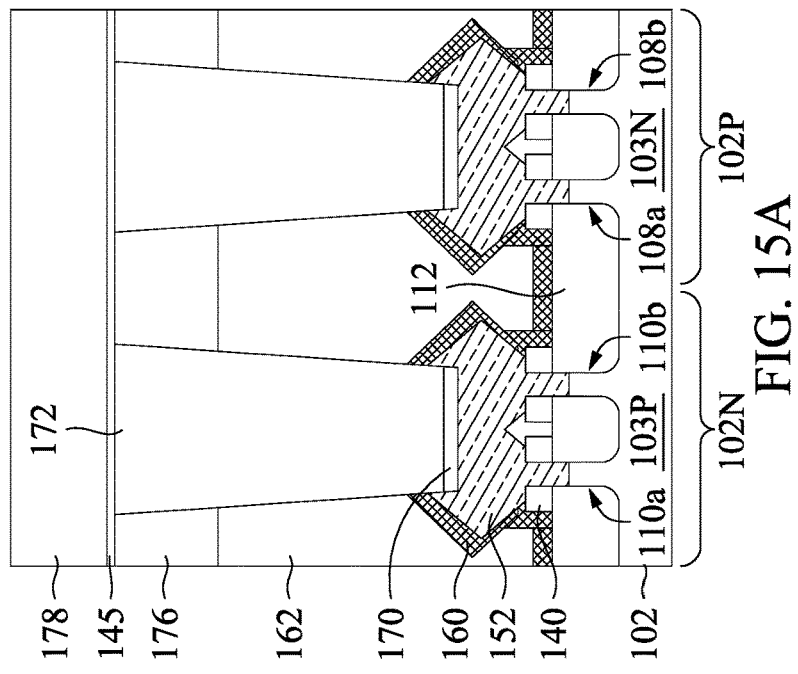
Figure 15B:
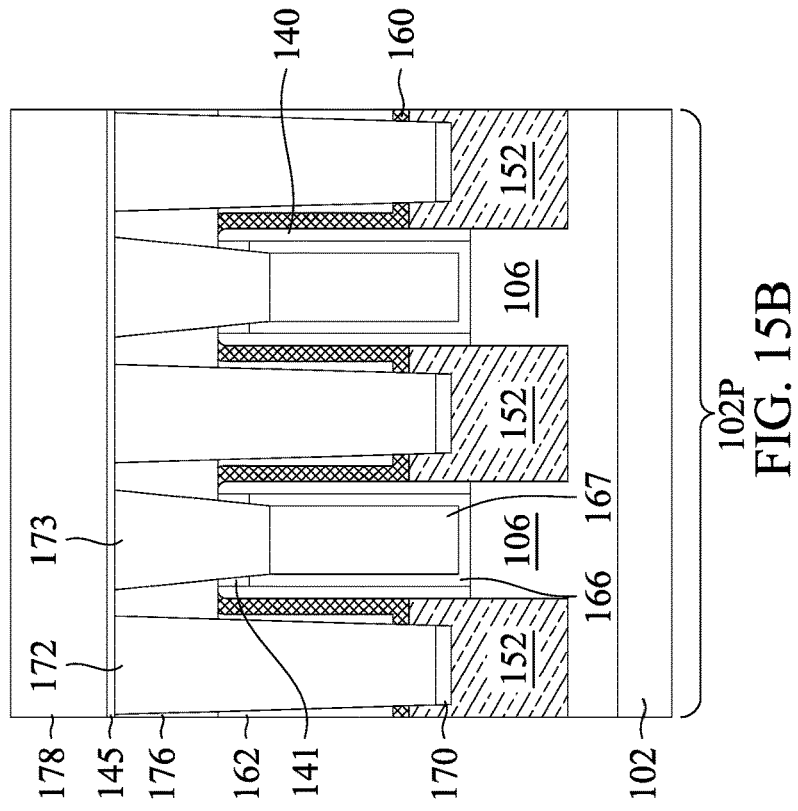

In FIGS. 15A-15B, an etch stop layer 145 and a third ILD 178 are sequentially formed over the semiconductor device structure 100. The etch stop layer 145 may be silicon nitride, silicon carbide, silicon oxide, low-k dielectrics such as carbon doped oxides, extremely low-k dielectrics such as porous carbon doped silicon dioxide, the like, or a combination thereof, and deposited by CVD, PVD, ALD, a spin-on-dielectric process, the like, or a combination thereof. In one embodiment, the etch stop layer 145 is silicon nitride. The third ILD 178 may include the same material as the first ILD 162 and be deposited using the same fashion as the first ILD 162, as discussed above with respect to FIGS. 7A and 7B. In some embodiments, the etch stop layer 145 may have a thickness in a range of about 100 Angstroms to about 300 Angstroms, and the third ILD 178 may have a thickness in a range of about 200 Angstroms to about 700 Angstroms.

Figure 16A:
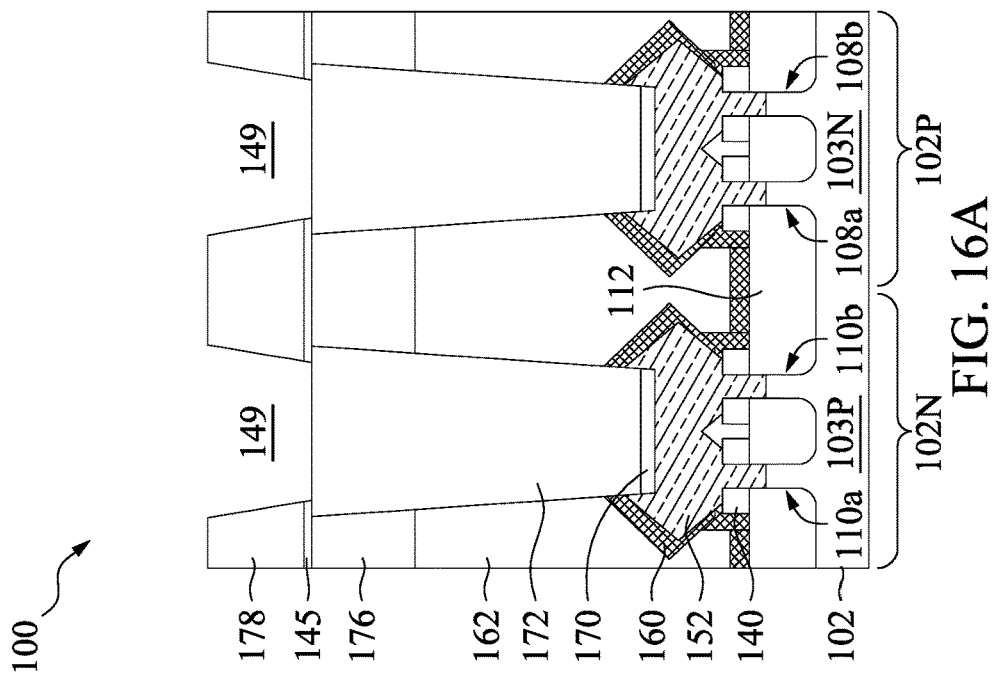
Figure 16B:
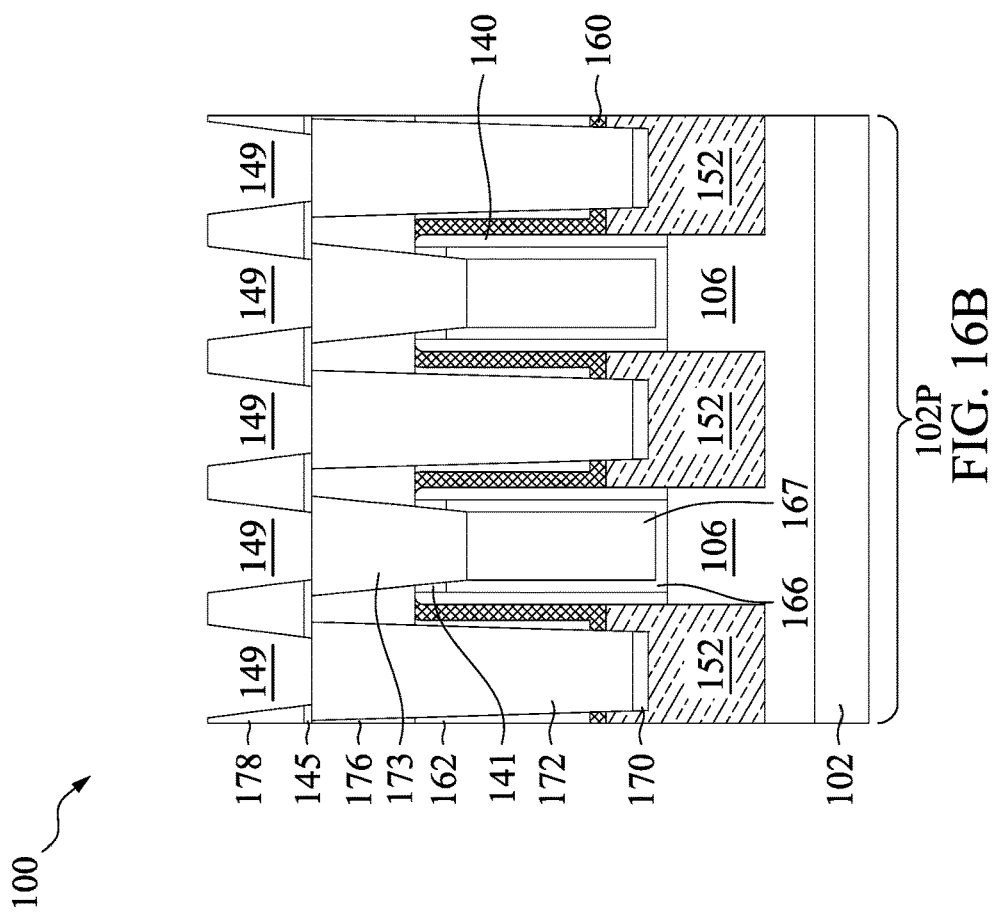

In FIGS. 16A-16B, portions of the third ILD 178 and the etch stop layer 145 disposed over the conductive features 172, 173 are removed. The removal of the portions of the third ILD 178 and the etch stop layer 145 forms via contact openings 149 exposing the conductive features 172, 173. A patterned layer (not shown) may be first formed on portions the third ILD 178. The patterned layer has openings at locations aligned with the S/D epitaxial features 152 and the gate electrode layer 167. The removal of the portions of the third ILD 178 and the etch stop layer 145 may be performed, using the patterned layer as a mask, by one or more etch processes, such as a wet etch, dry etch, or a combination thereof (i.e., first etch process). In one embodiment, the portions of the third ILD 178 and the etch stop layer 145 are removed using a dry etch process, such as RIE or other suitable anisotropic etch process. Exemplary dry etch process for removing portions of the third ILD 178 and the etch stop layer 145 may utilize a capacitively coupled plasma (CCP) source, an inductively coupled plasma (ICP) source, or glow discharge plasma (GDP) source driven by an RF power generator or a microwave plasma source using a tunable frequency ranging from about 2 MHz to about 2.45 GHz, such as about 13.56 MHz. The chamber may be operated at a pressure in a range of about 0.3 mTorr to about 20 Torr and a temperature of about −80 degrees Celsius to about 240 degrees Celsius. The RF power generator is operated to provide source power between about 100 W to about 2000 W, and the output of the RF power generator controlled by an optional pulse signal having a duty cycle in a range of about 10% to about 90%. An RF biasing power to the substrate support on which semiconductor device structure 100 is disposed may be in a range of about 100 W to about 1200 W. The source power and the biasing power may be controlled so that the ion acceleration energy is between about 20 eV to about 200 eV (e.g., 50 eV to about 150 eV). The dry etch process may use a plasma formed from a gas mixture containing one or more etching gases, such as hydrogen bromide (HBr), chlorine ($Cl_2$), hydrogen ($H_2$), methane ($CH_4$), nitrogen ($N_2$), helium (He), neon (Ne), krypton (Kr), tetrafluoromethane ($CF_4$), trifluoromethane ($CHF_3$), methyl fluoride ($CH_3F$), difluoromethane ($CH_2F_2$), hexafluoroethane ($C_2F_6$), octofluorocyclobutane ($C_4F_8$), hexafluorobutadiene ($C_4F_6$), sulfur hexafluoride ($SF_6$), nitrogen trifluoride ($NF_3$), HCl (hydrogen chloride), $BCl_3$ (boron trichloride), oxygen ($O_2$), other suitable etching gas, and any combinations thereof. An inert gas, such as argon (Ar), may be provided with the etchants to increase bombardment effect and thus, enhanced etch rates of the third ILD 178 and the etch stop layer 145. In cases where the gas mixture comprises a chlorine-containing gas (e.g., $Cl_2$), an oxygen-containing gas (e.g., $O_2$), and argon, the chlorine-containing gas, the oxygen-containing gas, and argon may be introduced into the process chamber at a ratio ($Cl_2$:$O_2$:Ar) of about 10:1:5 to about 50:1:5, for example about 20:1:5.

The sidewalls of the via contact openings 149 may be vertical or slanted. In some embodiments, the via contact openings 149 have a sidewall profile in which the dimension at the top is greater than the dimension at the bottom of the via contact openings 149. The via contact openings 149 may be a round-shaped and/or oval-shaped opening when viewing from top, such as the via contact openings 149 shown in FIG. 18-1. For example, in some embodiments the via contact openings 149 over the S/D epitaxial features 152 and the gate electrode layer 167 may have a round-shaped profile when viewing from top. In some embodiments, the via contact openings 149 over the S/D epitaxial features 152 and the gate electrode layer 167 may have an oval-shaped profile when viewing from top. In some embodiments, the via contact openings 149 over the S/D epitaxial features 152 may have a round-shaped profile when viewing from top, and the via contact openings 149 over the gate electrode layer 167 may have an oval-shaped profile when viewing from top, or vice versa. Upon formation of the via contact openings 149, the patterned layer may be removed using any suitable process, such as an ash process. Alternatively, the patterned layer may not be removed until the subsequent second etch process is complete.

Figure 17A:
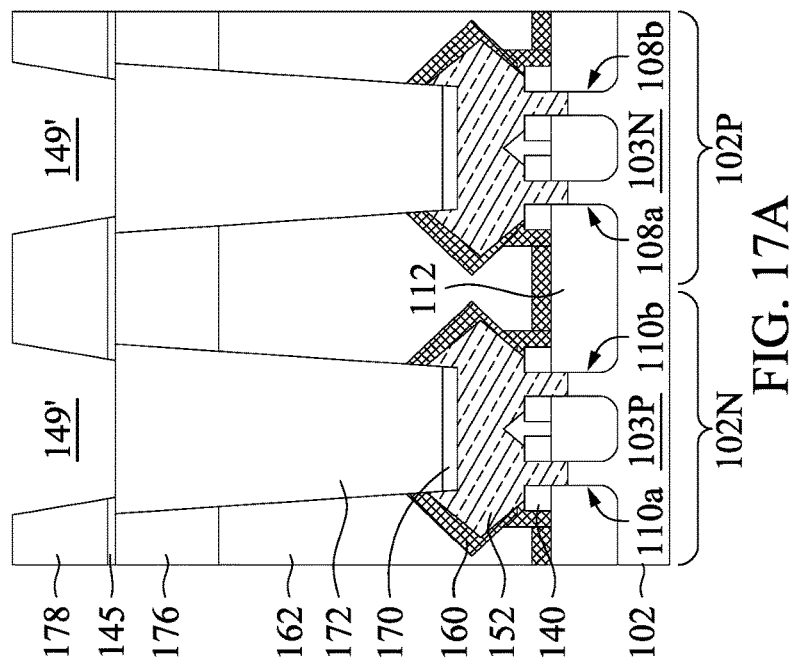
Figure 17B:
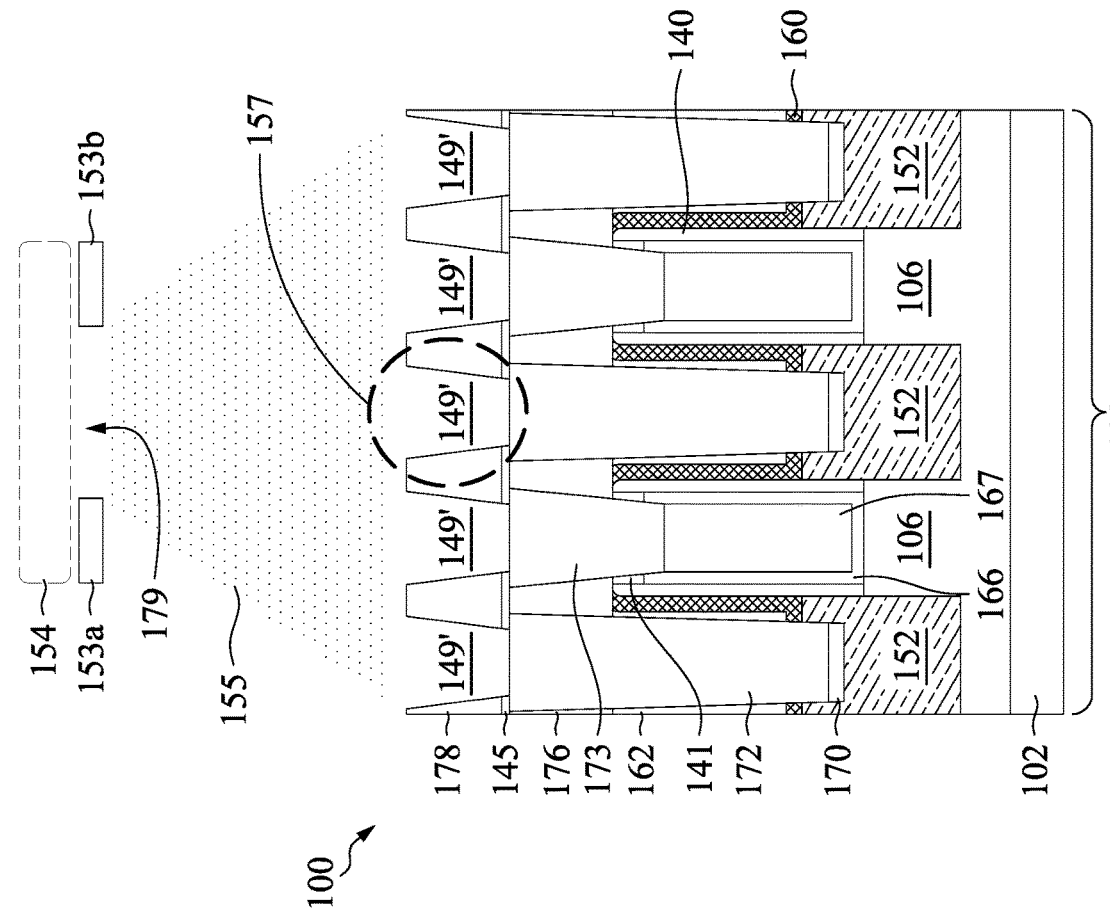
Figures 1, 17B:
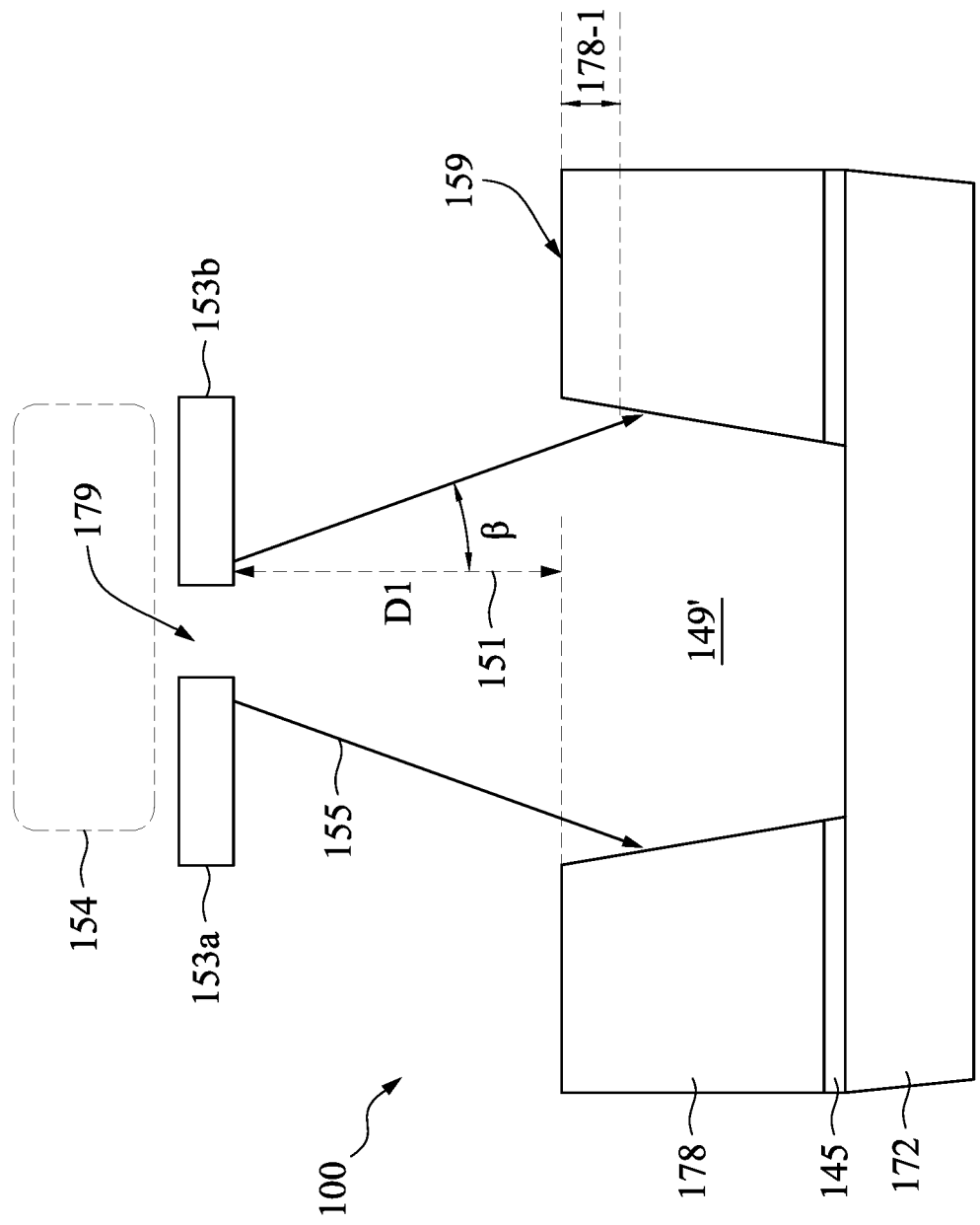

In FIGS. 17A-17B, the via contact openings 149 are further etched by a second etch process. In some embodiments, the second etch process is performed in a process chamber separated from the process chamber for performing the first etch process. The second etch process is performed so that at least one dimension of the via contact openings 149 (e.g., X direction or Y direction) is further extended. The second etch process extends, for example, the dimension along the Y direction of the via contact openings 149, which increases the contact area between the via contact openings 149 and the neighboring metal features in the bank-end-of-line (BEOL). The increase of the contact area of the via contact openings 149 enable better gap-filling while reducing the contact resistance effectively. In some embodiments, the second etch process is a dry etch process, such as an ion beam etch (IBE), reactive ion beam etch (RIBE), bombardment etch, sputtering etch, or the like. In one exemplary embodiment shown in FIGS. 17A and 17B, the second etch process is a reactive ion beam etch. The reactive ion beam etch process may involve forming a plasma 154 and directing a reactive ion beam 155 to the semiconductor device structure 100. The reactive ion beam 155 may be extracted from the plasma 154 through an extraction aperture 179, between extraction part 153a and extraction part 153b, to carry out material removal processes on the third ILD 178 and the etch stop layer 145. During operation, the semiconductor device structure 100 is moved relative to the reactive ion beam 155. The reactive ion beam 155 is a beam of charged particles (i.e., ions) to be directed to scan over the semiconductor device structure 100 along the X or Y direction, thereby removing portions of the third ILD 178 and the etch stop layer 145. After the second etch process, the via contact openings 149 has at least one dimension extended and become via contact openings 149'. In some embodiments, the shape of the via contact openings 149' is extended along the Y direction only. If the via contact openings 149 have a rounded shape before the second etch process, the via contact openings 149' may become an elongated circle along the Y-direction or oval in shape. If the via contact openings 149 have an oval shape, the via contact openings 149' may become an elongated oval shape along the Y-direction, as to be discussed below with respect to FIGS. 18-1 and 18-2.

The reactive ion beam etch process may use an inert gas (e.g., He, Ne, Kr, Ar) and/or an etching gas. Suitable etching gas may be a fluorine-containing gas and/or a chlorine-containing gas, such as $CF_4$, $CHF_3$, $CH_3F$, $CH_2F_2$, $C_4F_8$, $C_4F_6$, $SF_6$, $C_2F_6$, $NF_3$, HCl, $BCl_3$, and other suitable reactive gases, and any combinations thereof. In some embodiments, an oxygen-containing gas (e.g., $O_2$, $O_3$, etc.) may also be used. During etching and/or by directing etch ions in an IBE or RIBE etch process towards the semiconductor device structure 100, a bias power is also applied to the semiconductor device structure 100 to enhance anisotropic etch of the materials of the third ILD 178 and the etch stop layer 145. Exemplary reactive ion beam etch process for removing portions of the third ILD 178 and the etch stop layer 145 may utilize a CCP, ICP, or GDP source driven by an RF power generator or a microwave plasma source using a tunable frequency ranging from about 2 MHz to about 2.45 GHz, such as about 13.56 MHz. The chamber may be operated at a pressure in a range of about 0.3 mTorr to about 20 Torr and a temperature of about −80 degrees Celsius to about 240 degrees Celsius. The RF power generator is operated to provide source power between about 100 W to about 1000 W, and the output of the RF power generator controlled by an optional pulse signal having a duty cycle in a range of about 10% to about 90%. The substrate support on which semiconductor device structure 100 is disposed may be biased with respect to the plasma in a range of about 0.1 kV to about 12 kV. The source power and the biasing power may be controlled so that the ion acceleration energy is between about 20 eV to about 200 eV (e.g., 50 eV to about 150 eV).

In some embodiments, which can be combined with one or more embodiments of the present disclosure, the removal of the third ILD 178 and the etch stop layer 145 may be done by a cyclic process including repetitions of a first etching step (as discussed above with respect to FIGS. 16A-16B) and a second etching step (as discussed above with respect to FIGS. 17A-17B). The cyclic process may use alternating chlorine/oxygen/fluorine-based plasma and chlorine/oxygen/fluorine-based plus argon plasma. For example, the first etching step may use a fluorine/chlorine and oxygen-based plasma and the second plasma etching step may use a fluorine/chlorine and oxygen-based plasma plus argon plasma, or vice versa.

FIG. 17B-1 is an enlarged view of a portion 157 of the semiconductor device structure 100 showing the third ILD 178 being etched by the reactive ion beam 155 in accordance with some embodiments. In one embodiment, the reactive ion beam 155 is scanned over the semiconductor device structure 100 along Y direction (e.g., the longitudinal direction of the replacement gate structures 177). The reactive ion beam 155 is extracted from the plasma 154 through the extraction aperture 179 and directed to the third ILD 178 and the etch stop layer 145 at an angle β with respect to a direction of a normal line 151 to a top surface 159 of the third ILD 178. In various embodiments, the angle β is less than about 50 degrees. In some embodiments, the angle β is in a range of about 15 degrees to about 45 degrees, for example about 20 degrees to about 30 degrees. If the angle β is greater than about 50 degrees, the reactive ion beam 155 may land on the sidewall at the top portion 178-1 of the third ILD 178, which is to be removed during the subsequent CMP process and thus has little or no impact on the sidewall profile of the resulting via contact opening 149'. In any case, the reactive ion beam 155 is directed at an angle so that the majority of As a result, the purpose of the second etch process is defeated. On the other hand, if the angle β is less than about 15 degrees, the reactive ion beam 155 may hit the exposed conductive features 172 and generate metal residues that may contaminate the transistors and affect the device performance. In some embodiments, the distance D1 between the extraction parts 153a, 153b and the top surface 159 of the third ILD 178 may be in a range of about 7 mm to about 14 mm. A skilled artisan in the art may control, for example, the source power, the biasing power, and the distance D1 between the extraction parts 153a, 153b and the top surface 159 of the third ILD 178 to adjust the angle β of the ion beam 155. Additionally or alternatively, the semiconductor device structure 100 may be tilted to alter the direction of impact of the reactive ion beam 155.

FIG. 18-1 illustrates a top view of a portion of the third ILD 178 showing the profile of the via contact opening 149 prior to the reactive ion beam etch process. FIG. 18-2 illustrates a top view of a portion of the third ILD 178 showing the profile of the via contact openings 149' after the reactive ion beam etch process in accordance with some embodiments. As discussed above, if the via contact openings 149 have a rounded shape before the second etch process, the via contact openings 149' may become an elongated circle or oval shape after the reactive ion beam etch process. If the via contact openings 149 have an oval shape, the via contact openings 149' may become an elongated oval shape after the reactive ion beam etch process. As can be seen, some via contact openings 149, such as via contact openings 149-1 in a first region of the third ILD 178, may have a rounded shape, and some via contact openings 149, such as via contact openings 149-2 in a second region of the third ILD 178, may have an oval shape. In some embodiments, the via contact openings 149-1 are disposed over a replacement gate structure and the via contact openings 149-2 are disposed over a source/drain epitaxial features. Prior to the reactive ion beam etch process, the via contact openings 149-1 may have a dimension D2 along the Y-direction and a dimension D6 along the X-direction, and the via contact openings 149-2 may have a dimension D3 along the Y-direction and a dimension D7 along the X-direction. After the reactive ion beam etch process, the via contact openings 149'-1 are extended/elongated along the Y-direction and may have a dimension D4 greater than the dimension D2 of the via contact openings 149-1. The dimension D8 of the via contact openings 149'-1 extending along the X-direction may be substantially the same or slightly greater than the dimension D6 of the via contact openings 149-2. Likewise, the via contact openings 149'-2 are extended/elongated along the Y-direction and may have a dimension D5 greater than the dimension D3 of the via contact openings 149-2. The dimension D9 of the via contact openings 149'-2 extending along the X-direction may be substantially the same or slightly greater than the dimension D7 of the via contact openings 149'-2. In various embodiments, the dimension D2 and dimension D6 of the via contact openings 149-1 may be at a ratio (D2:D6) of about 1:1. The dimension D4 and dimension D8 of the via contact openings 149'-1 may be at a ratio (D4:D8) of about 4:1 to about 8:1, for example about 7:1. Similarly, the dimension D3 and dimension D7 of the via contact openings 149-2 may be at a ratio (D3:D7) of about 2:1 to about 3:1. The dimension D5 and dimension D9 of the via contact openings 149'-2 may be at a ratio (D5:D9) of about 4:1 to about 8:1, for example about 5:1 to about 7:1.

In some embodiments, a cleaning process may be performed between the first etch process and the second etch process to remove residues from exposed surfaces of the semiconductor device structure 100. The cleaning process may be any suitable wet cleaning process including, for example, hydrofluoric acid (HF), standard clean 1 (SC1), and ozonated deionized water ($DIO_3$). In one embodiment, the cleaning process is performed by exposing the semiconductor device structure 100 to HF (1:500 dilution), followed by the $DIO_3$ rinsing and SC1 cleaning which may be a mixture of deionized (DI) water, ammonia hydroxide ($NH_4OH$), and hydrogen peroxide ($H_2O_2$). Other cleaning process, such as an APM process, which includes at least water ($H_2O$), $NH_4OH$, and $H_2O_2$, a HPM process, which includes at least $H_2O$, $H_2O_2$, and hydrogen chloride (HCl), a SPM process (also known as piranha clean), which includes at least $H_2O_2$ and sulfuric acid ($H_2SO_4$), or any combination thereof, may also be used.

Figure 19A:
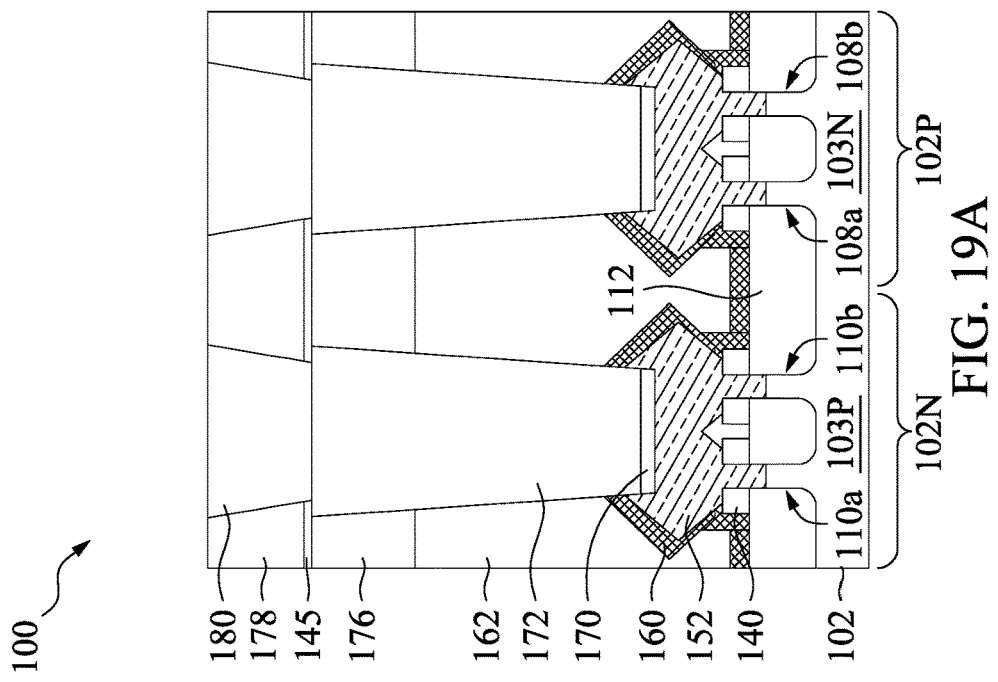
Figure 19B:
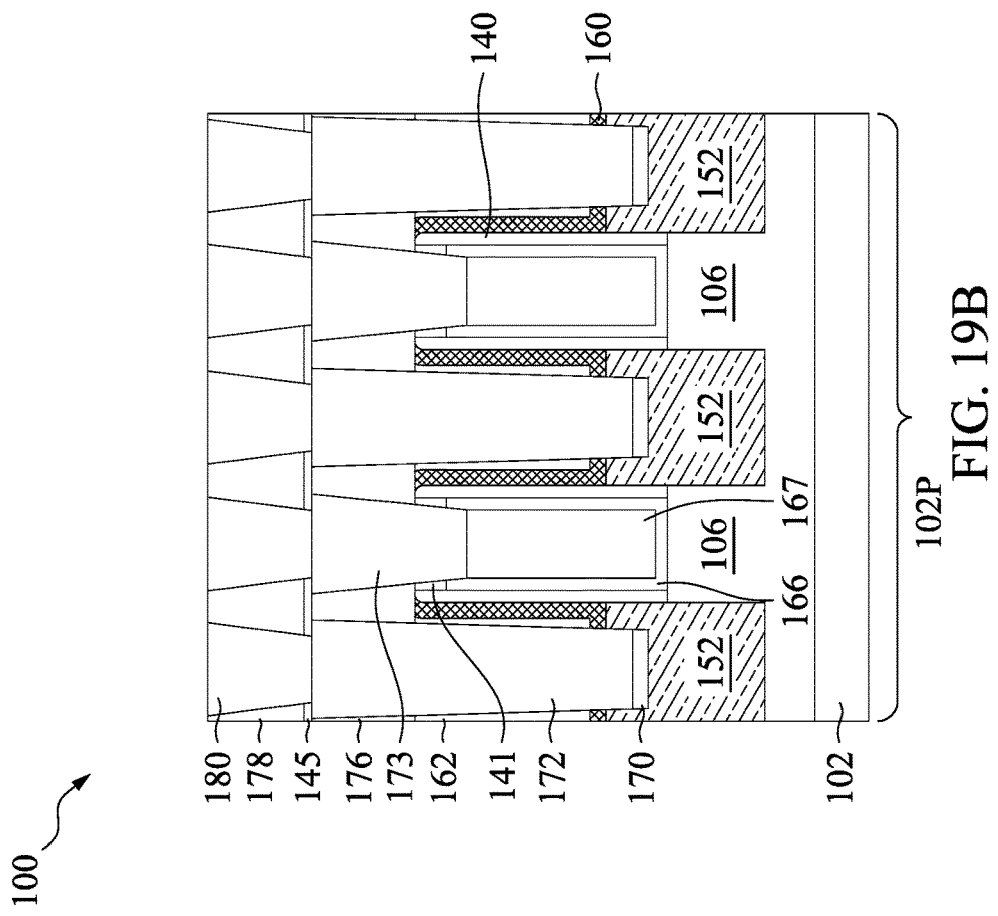

In FIGS. 19A-19B, conductive features 180 are formed in the via contact openings 149'. The conductive features 180 serve as via contacts for connecting to the epitaxial S/D features 152 through S/D contacts (e.g., conductive features 172) and connecting to the gate electrode layers 167 through gate contacts (e.g., conductive features 173). The conductive features 180 may include the same material as the conductive features 172, 173, such as one or more of Ru, Mo, Co, Ni. W, Ti, Ta, Cu, Al, TiN and TaN. The conductive feature 180 may be formed by any suitable process, such as PVD, CVD, ALD, electrochemical plating, or other suitable method. Once the conductive features 180 are formed, a planarization process, such as CMP, is performed on the semiconductor device structure 100 until the top surface of the third ILD 178 is exposed.

In FIGS. 20A-20B, an interconnect structure 117 is formed over the semiconductor device structure 100. In some embodiments, the interconnect structure 117 comprises a plurality of intermetal dielectric (IMD) layers 168a-168n, a plurality of conductive features 169a-169n embedded in the plurality of IMD layers, and a plurality of etch stop layers 171a-171n disposed between ILD and IMD layer (e.g., the third ILD 178 and the first IMD layer 168a) and between IMD layers (e.g., the first IMD layer 168a and the second IMD layer (not shown)). The 1 MB layers, the conductive features, and the etch stop layers may repeat until a desired number of the IMD layer 168n (e.g., topmost 1 MB layer in the interconnect structure 117), a desired number of the etch stop layer 171n, and a desired number of the conductive features 169n (e.g., topmost conductive features in the interconnect structure 117) embedded in the IMD layer 168n is achieved. Conductive features (e.g., conductive vias and conductive lines) may be formed using any suitable formation process (e.g., lithography with etching, damascene, dual damascene, or the like). In some embodiments, the steps for forming the conductive features may include forming openings in the respective dielectric layers, depositing a conductive layer in the openings, and subsequently performing a planarization process, such as a CMP process, to remove excess materials of the conductive material overfilling the openings. The conductive layer may be deposited by CVD, PVD, sputtering, electroplating, electroless plating, or other suitable deposition technique.

The IMD layers 168a-n may include or be formed of any suitable dielectric material, such as silicon oxide, a low dielectric constant (low-k) material, or a combination thereof. The low-k material may include fluorinated silica glass (FSG), phosphosilicate glass (PSG), borophosphosilicate glass (BPSG), amorphous fluorinated carbon, Parylene, BCB (bis-benzocyclobutenes), polyimide, SiOxCyHz, or SiOxCy, where x, y and z are integers or non-integers, and/or other future developed low-k dielectric materials. The 1 MB layers 168a-n may be deposited by a plasma-enhanced CVD (PECVD) process or other suitable deposition technique. The material of the etch stop layers 171a-n is chosen such that etch rates of the etch stop layers 171a-n are less than etch rates of the 1 MB layers 168a-n. In some embodiments, the etch stop layers 171a-n may include the same material as the etch stop layer 145 described above. The conductive vias/lines 169a-n may include or be formed of any suitable electrically conductive material, such as W, Ru, Co, Cu, Ti, TiN, Ta, TaN, Mo, Ni, or combinations thereof.

The present disclosure provides a method for forming a semiconductor device structure by increasing contact area between via contacts of the source/drain (S/D) contacts and the gate contacts and the neighboring metal features in the back-end-of-line (BEOL). After formation of the via contact openings using a first etch process, a reactive ion beam etch process is performed to further extend one dimension of the via contact openings so that the dimension of the via contact openings along the Y-direction is at least 7 times greater than the dimension of the via contact openings along the X-direction. The via contact openings can be extended with rounder profile without limitation of lithography. The increased via contact openings allow for better metal gap-filling. Since the via contacts as formed have increased contact area, the contact resistance can be reduced effectively. As a result, high performance of integrated circuits (ICs) can be achieved.

An embodiment is a method for forming a semiconductor device structure. The method includes including forming one or more conductive features in a first interlayer dielectric (ILD), forming an etch stop layer on the first ILD, forming a second ILD over the etch stop layer, forming one or more openings through the second ILD and the etch stop layer to expose a top surface of the one or more first conductive features, wherein the one or more openings are formed by a first etch process in a first process chamber, exposing the one or more openings to a second etch process in a second process chamber so that the shape of the or more openings is elongated, and filling the one or more openings with a conductive material.

Another embodiment is a method for forming a semiconductor device structure. The method includes forming a fin structure from a substrate, forming a sacrificial gate structure over a portion of the fin structure, removing portions of the fin structure not covered by the sacrificial gate structure, forming a source/drain feature in regions created as a result of removal of the portions of the fin structure, forming sequentially a contact etch stop layer (CESL) and a first interlayer dielectric (ILD) on the source/drain feature, removing the sacrificial gate structure to expose a portion of the fin structure, forming sequentially a gate dielectric layer and a gate electrode layer on exposed portion of the fin structure, forming a second ILD over the first ILD and the gate electrode layer, forming first contact openings through the second ILD, the first ILD, and the CESL to expose a portion of the source/drain feature, forming second contact openings through the second ILD to expose a portion of the gate electrode layer, forming source/drain contacts and gate contacts by filling the first and second contact openings with a first conductive material, forming sequentially an etch stop layer and a third ILD over the source/drain contacts and the gate contacts, performing a first etch process in a first process chamber to form via contact openings, wherein the via contact openings extend through the third ILD and the etch stop layer to expose the source/drain contacts and the gate contacts, subjecting the via contact openings to a second etch process in a second process chamber, and filling the via contact openings with a second conductive material.

A further embodiment is a method for forming a semiconductor device structure. The method includes forming a first conductive feature in a first interlayer dielectric (ILD) over a gate electrode layer, forming a second conductive feature in the first ILD over a source/drain epitaxial feature, forming a second ILD over the first ILD, forming via openings through the second ILD to expose a top surface of the first conductive feature and a top surface of the second conductive feature, wherein the via openings are etched through a mask by a first etch process, removing the mask, exposing the via openings to a second etch process so that a dimension of the via openings along a first direction is elongated, and filling the via openings with a conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device structure, comprising:
   forming one or more conductive features in a first interlayer dielectric (ILD);
   forming an etch stop layer on the first ILD;
   forming a second ILD over the etch stop layer;
   forming one or more openings through the second ILD and the etch stop layer to expose a top surface of the one or more first conductive features, wherein the one or more openings are formed by a first etch process in a first process chamber;
   exposing the one or more openings to an ion beam of a second etch process in a second process chamber at an angle of about 50 degrees or less with respect to a direction of a normal line to a top surface of the second ILD so that a shape of the or more openings is elongated; and
   filling the one or more openings with a conductive material.

2. The method of claim 1, wherein the first etch process is a plasma-based etch process and the second etch process is a reactive ion beam etch process.

3. The method of claim 1, wherein the second etch process comprises: forming a plasma in the second process chamber; and
   directing the ion beam of reactive ions from the plasma to the one or more openings so that a first dimension of the one or more openings is increased to a second dimension after the second etch process.

4. The method of claim 3, further comprising: scanning the ion beam over the one or more openings wherein the beam of reactive ions is directed at an angle of about 50 degrees or less with respect to a direction of a normal line to a top surface of the second ILD.

5. The method of claim 4, wherein the angle is in a range of about 20 degrees to about 30 degrees.

6. The method of claim 3, wherein the second dimension of the one or more openings remain substantially the same after the second etch process.

7. The method of claim 6, wherein the first dimension and the second dimension have a ratio (first dimension: second dimension) in a range of about 1:4 to about 1:8.

8. The method of claim 3, further comprising:
applying a bias power to a substrate support on which the semiconductor device structure is disposed.

9. The method of claim 8, wherein the bias power is in a range of about 0.1 kV to about 12 kV.

10. A method for forming a semiconductor device structure, comprising: forming a fin structure from a substrate;
forming a sacrificial gate structure over a portion of the fin structure;
removing portions of the fin structure not covered by the sacrificial gate structure;
forming a source/drain feature in regions created as a result of removal of the portions of the fin structure;
forming sequentially a contact etch stop layer (CESL) and a first interlayer dielectric (ILD) on the source/drain feature;
removing the sacrificial gate structure to expose the portion of the fin structure;
forming sequentially a gate dielectric layer and a gate electrode layer on the exposed portion of the fin structure;
forming a second ILD over the first ILD and the gate electrode layer;
forming first contact openings through the second ILD, the first ILD, and the CESL to expose a portion of the source/drain feature;
forming second contact openings through the second ILD to expose a portion of the gate electrode layer;
forming source/drain contacts and gate contacts by filling the first and second contact openings with a first conductive material;
forming sequentially an etch stop layer and a third ILD over the source/drain contacts and the gate contacts;
performing a first etch process in a first process chamber to form via contact openings, wherein the via contact openings extend through the third ILD and the etch stop layer to expose the source/drain contacts and the gate contacts;
subjecting the via contact openings to an ion beam of a second etch process in a second process chamber at an angle of about 50 degrees or less with respect to a direction of a normal line to a top surface of the third ILD so that a dimension of the via openings is elongated; and
filling the via contact openings with a second conductive material.

11. The method of claim 10, wherein the second etch process is a reactive ion beam etch process.

12. The method of claim 11, further comprising:
applying a biasing power to a substrate support on which the semiconductor device structure is disposed.

13. The method of claim 11, further comprising: scanning the ion beam over the via contact openings.

14. The method of claim 13, wherein the reactive ion beam etch process is performed such that the dimension along the Y-direction is about 7 times the dimension along X-direction.

15. The method of claim 13, wherein the ion beam is extracted from a plasma through an extraction aperture between extraction parts, and a distance between the extraction parts and the top surface of the third ILD is in a range of about 7 mm to about 14 mm.

16. The method of claim 15, wherein the plasma is formed from a fluorine-containing gas, a chlorine-containing gas, an inert gas, an oxygen-containing gas, or combination thereof.

17. The method of claim 10, wherein the etch stop layer has a thickness of about 100 Angstroms to about 300 Angstroms, and the third ILD has a thickness of about 200 Angstroms to about 700 Angstroms.

18. A method for forming a semiconductor device structure, comprising:
forming a first conductive feature in a first interlayer dielectric (ILD) over a gate electrode layer; forming a second conductive feature in the first ILD over a source/drain epitaxial feature;
forming a second ILD over the first ILD;
forming via openings through the second ILD to expose a top surface of the first conductive feature and a top surface of the second conductive feature, wherein the via openings are etched through a mask by a first etch process in a first process chamber;
removing the mask;
exposing the via openings to a beam of reactive ions at an angle of about 50 degrees or less with respect to a direction of a normal line to a top surface of the second ILD of a second etch process in a second process chamber so that a dimension of the via openings along a first direction is elongated; and
filling the via openings with a conductive material.

19. The method of claim 18, wherein the second etch process comprises:
applying a bias power to a substrate support on which the semiconductor device structure is disposed; and.

20. The method of claim 19, further comprising:
after the first etch process, exposing the via openings to a cleaning process.

* * * * *